United States Patent
Nakakuki et al.

(10) Patent No.: US 9,799,576 B2
(45) Date of Patent: Oct. 24, 2017

(54) MONITORING METHOD AND MANUFACTURING METHOD OF SEMICONDUCTOR DEVICE

(71) Applicant: Renesas Electronics Corporation, Tokyo (JP)

(72) Inventors: Masahide Nakakuki, Hitachinaka (JP); Mikio Shimizu, Hitachinaka (JP); Ryoichi Shinohara, Hitachinaka (JP); Toshihiro Nakajima, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/253,569

(22) Filed: Aug. 31, 2016

(65) Prior Publication Data
US 2017/0110380 A1    Apr. 20, 2017

(30) Foreign Application Priority Data
Oct. 15, 2015  (JP) .................................. 2015-203687

(51) Int. Cl.
*H01L 21/00*   (2006.01)
*H01L 21/66*   (2006.01)
(Continued)

(52) U.S. Cl.
CPC ........ *H01L 22/26* (2013.01); *H01L 21/02694* (2013.01); *H01L 21/67115* (2013.01); *H01L 21/67248* (2013.01)

(58) Field of Classification Search
CPC ............... H01L 22/26; H01L 21/02694; H01L 21/67115; H01L 21/67248
(Continued)

(56) References Cited

U.S. PATENT DOCUMENTS 5,832,990 A * 11/1998 Eisenhour ............ B60H 1/0075
                                                        165/202
6,746,908 B2 * 6/2004 Tanaka ..................... C23C 16/46
                                                        438/225
(Continued)

FOREIGN PATENT DOCUMENTS

JP        2000-223434 A    8/2000
JP        2001-102320 A    4/2001

*Primary Examiner* — Tod T Van Roy
*Assistant Examiner* — Vu A Vu
(74) *Attorney, Agent, or Firm* — McGinn IP Law Group, PLLC

(57) ABSTRACT

A monitoring method that can detect a sign of disconnection of a heat generation source is provided. Further, a highly reliable semiconductor device is provided. The monitoring method uses a first control device that samples outputs of a plurality of thermometers at a first frequency (100 Hz sampling in S10) and controls a plurality of heat generation sources based on temperature information obtained by sampling, and a second control device that forms information based on temperature information obtained by sampling at the first frequency (100 Hz sampling in S20) and pieces of heat-generation-source information obtained by sampling of outputs of the respective heat-generation sources at the first frequency (100 Hz sampling in S20). Based on the temperature information obtained by sampling at the first frequency (100 Hz sampling in S20) and the pieces of heat-generation-source information obtained by sampling at the first frequency (100 Hz sampling in S20), states of the heat generation sources are monitored.

16 Claims, 16 Drawing Sheets

(51) Int. Cl.
    *H01L 21/02* (2006.01)
    *H01L 21/67* (2006.01)
(58) Field of Classification Search
    USPC .............................................................. 438/5
    See application file for complete search history.

(56) References Cited

U.S. PATENT DOCUMENTS

| | | | | |
|---|---|---|---|---|
| 7,368,303 | B2* | 5/2008 | You | H01L 21/67248 257/E21.324 |
| 8,878,461 | B2* | 11/2014 | Serebryanov | H05B 37/036 315/291 |
| 2009/0120924 | A1* | 5/2009 | Moffatt | B23K 26/0626 219/385 |
| 2013/0287377 | A1* | 10/2013 | Serebryanov | H01L 21/67115 392/411 |

* cited by examiner

MONITORING METHOD AND MANUFACTURING METHOD OF SEMICONDUCTOR DEVICE

CROSS-REFERENCE TO RELATED APPLICATIONS

The disclosure of Japanese Patent Application No. 2015-203687 filed on Oct. 15, 2015 including the specification, drawings and abstract is incorporated herein by reference in its entirety.

BACKGROUND

The present invention relates to a monitoring method and a manufacturing method of a semiconductor device, and in particular relates to a monitoring method for monitoring a state of a heat generation source used in a thermal process (annealing) and a manufacturing method of a semiconductor device including an annealing step.

A semiconductor device includes a number of transistors formed therein, which are field effect transistors (hereinafter, also called MOSFETs), for example. In order to achieve a more highly integrated semiconductor device, miniaturization is advancing. With this, the dimension of a gate and the sizes of a source region and a drain region of the MOSFET have been decreasing.

The source region and the drain region of the MOSFET are formed by implanting impurities into regions respectively forming those regions and performing annealing, for example. Annealing described here means to a thermal process performed for activating the implanted impurities and for recovering crystal defects caused by implantation of the impurities. By performing the thermal process, the implanted impurities are activated and the crystal defects are recovered. However, the thermal process causes the source region or/and the drain region to expand. The characteristics of the MOSFET are largely affected by an activation ratio of the impurities, expansion of the source region and the drain region, and the like. As miniaturization advances, this effect becomes larger, so that allowable margin is reduced to be very small.

Annealing is a step that determines activation of implanted impurities and expansion of an impurity region. An RTP (Rapid Thermal Process) device used in the step of annealing (an annealing step) uses a lamp as a heat generation source, for example. Japanese Unexamined Patent Application Publications Nos. 2000-223434 and 2001-102320, for example, describe an annealing device that uses the lamp as the heat generation source and radiates light from the lamp onto an object to be processed to heat the object to be processed.

SUMMARY

Deterioration or disconnection of the lamp as the heat generation source causes a change of a temperature for heating the object to be processed, thus making it difficult to obtain a desired activation ratio of the impurities and desired expansion of the impurity region. As a result, reliability of the semiconductor device is lowered. Therefore, detection of a sign of deterioration or disconnection of the lamp is an important issue.

Japanese Unexamined Patent Application Publications Nos. 2000-223434 and 2001-102320 describe a technique for detecting that the lamp has gone out (lamp disconnection). However, both publications fail to describe or suggest detection of the sign of the lamp disconnection, for example.

Other problems and novel features will be apparent from the description of the present specification and the accompanying drawings.

A monitoring method according to an embodiment uses a first control device that performs sampling of outputs of a plurality of thermometers at a first frequency and controls a plurality of heat generation sources based on temperature information obtained by the sampling, and a second control device that forms information based on temperature information obtained by sampling at the first frequency and pieces of heat-generation-source information obtained by sampling of outputs of the respective heat generation sources at the first frequency. Based on the temperature information obtained by the sampling at the first frequency and the pieces of heat-generation-source information obtained by the sampling at the first frequency, states of the heat generation sources are monitored.

An output of a lamp that is the heat generation source begins to change before the lamp is disconnected, although the change is very small. In one embodiment, this change is detected by monitoring, and a sign of lamp disconnection, for example, is detected.

The heat-generation sources are subjected to feedback control based on the temperature information obtained by the sampling at the first frequency in such a manner that an appropriate heating temperature is attained. The lamp is monitored based on the temperature information obtained by the sampling at the first frequency that is the same as a frequency of sampling in the feedback control and the heat-generation-source information.

According to one embodiment, it is possible to provide a monitoring method that can detect a sign of disconnection of a heat generation source. Also, reliability of a semiconductor device can be improved.

DETAILED DESCRIPTION

Figure 1:
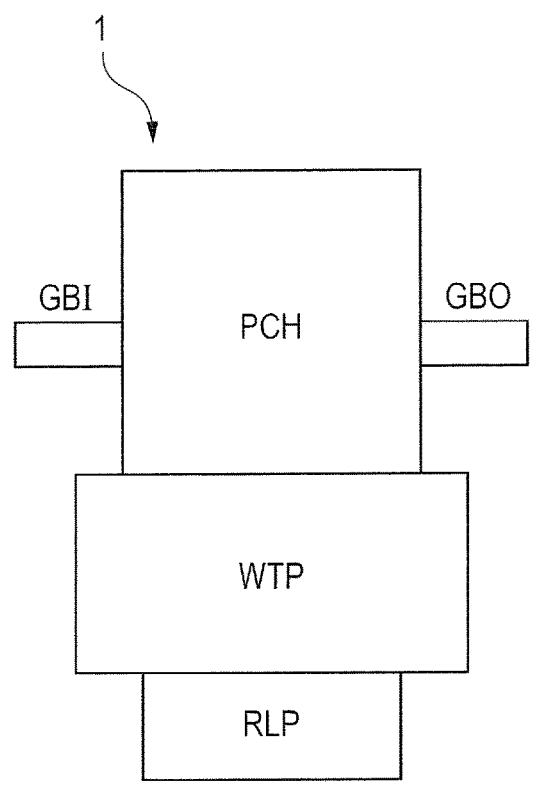
FIG. 1 is a plan view showing a configuration of an annealing device according to a first embodiment.

Embodiments of the present invention are described in detail below, referring to the drawings. Throughout the drawings for explaining the embodiments, the same portions are labeled with the same reference signs in principle, and the redundant description is omitted in principle.

Further, an annealing device used in an annealing step in manufacturing of a semiconductor device is described as an example in the present specification. However, the present invention is not limited thereto.

First Embodiment

<Annealing Device>

FIG. 1 is a plan view showing a configuration of an annealing device according to a first embodiment. Annealing devices include a heater heating type and a lamp heating type, for example. The lamp heating type is also known as an RTP annealing device in general. A spike annealing device is a kind of the RTP annealing device and can perform annealing at a higher temperature for a shorter period. This first embodiment uses the spike annealing device.

A spike annealing device 1 includes a process chamber PCH, a wafer transport portion WTP, and a load port RLP on which a cassette with a plurality of wafers accommodated therein is placed. In a manufacturing step of a semiconductor device, a predetermined number of semiconductor wafers, each having a predetermined region with impurity ions implanted thereto, are accommodated as one lot in one cassette, to be placed on the load port RLP. The semiconductor wafer is taken out up of the cassette placed on the load port RLP, and is transferred to the wafer transport portion WTP. The semiconductor wafer transferred to the wafer transport portion WTP is carried into the process chamber PCH.

The process chamber PCH has a gas inlet GBI through which a predetermined gas is supplied and a gas outlet GBO through which the gas is discharged from the process chamber PCH. The semiconductor wafer carried into the process chamber PCH is heated, while the process chamber PCH is filled with the predetermined gas. In this state, the process chamber PCH is sealed. By heating the semiconductor wafer, annealing is performed. When annealing is finished, the semiconductor wafer is transferred to the wafer transport portion WTP again, is then transferred from the wafer transport portion WTP to the cassette placed on the load port RLP, and is accommodated into the cassette. The plural semiconductor wafers accommodated in the cassette are transferred as one lot to a next manufacturing step.

To the annealing device 1 are coupled a first computer (a first control device) FEPC that controls the annealing device 1 and a second computer (a second control device) EEPC that monitors the state of the annealing device 1, although those are omitted in FIG. 1. The first computer FEPC and the second computer EEPC are coupled to a management computer (a third control device) MPC installed in a factory where various kinds of manufacturing devices for manufacturing the semiconductor device are arranged. From the first computer FEPC and the second computer EEPC, various types of data related to annealing is provided to the management computer MPC. The spike annealing device 1 shown in FIG. 1 can be regarded as one of the manufacturing devices installed in the factory, and various types of data is provided from the respective manufacturing devices to the management computer MPC.

Figure 2:
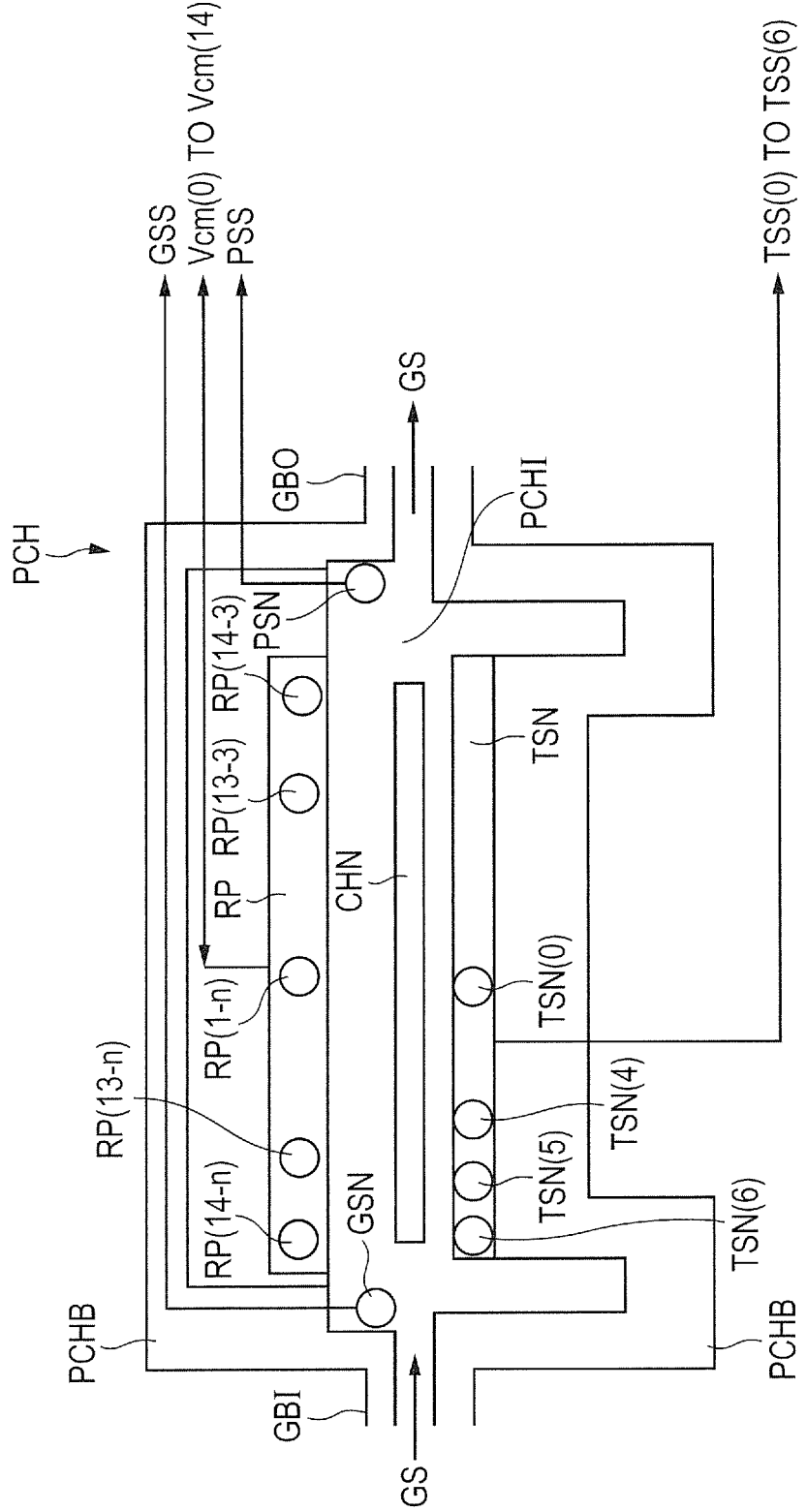
FIG. 2 is a cross-sectional view of a process chamber according to the first embodiment.

FIG. 2 is a cross-sectional view of the process chamber PCH. In FIG. 2, PCHB denotes a housing of the process chamber PCH, RP denotes a lamp, CHW denotes a semiconductor wafer carried in, and TSN denotes a radiation thermometer. Further, in FIG. 2, GS denotes a predetermined gas. The gas GS is injected from the gas inlet GBI to a space PCHI inside the housing PCHB of the process chamber PCH, and is discharged from the gas outlet GBO. In FIG. 2, an arrow added to the gas GS shows a direction of a gas flow. A flow sensor GSN that measures a flow rate of the gas is provided in the process chamber PCH, although not specifically limited. Further, a pressure sensor PCN that measures a pressure inside the sealed process chamber PCH is provided in the process chamber PCH.

The lamp RP includes a plurality of halogen lamps. Each of the halogen lamps is arranged in parallel to a main surface of the lamp RP. In FIG. 2, apart of the halogen lamps are shown as RP(14-$n$), RP(13-$n$), RP(11-$n$), RP(13-3), and RP(14-3). The radiation thermometer TSN includes a plurality of thermometers TSN(0) to TSN(6). The thermometers TSN(0) to TSN(6) are arranged in parallel to a main surface of the radiation thermometer TSN.

Examples of the lamp RP and the radiation thermometer TSN will be described later referring to FIGS. 6 to 8, for example. In FIG. 2, lamp voltages supplied to the halogen lamps forming the lamp RP and lamp-state voltages output from the halogen lamps are shown as Vcm(0) to Vcm(14). Also, FIG. 2 shows temperature detection signals output from the thermometers TSN(0) to TSN(6) forming the radiation thermometer TSN, as TSS(0) to TSS(6). In FIG. 2, GSS denotes a flow-rate detection signal output from the flow sensor GSN and PSS denotes a pressure detection signal output from the pressure sensor PSN.

The semiconductor wafer CHW carried into the process chamber PCH has a first main surface and a second main surface opposed to each other. In the first main surface, a predetermined region with ion impurities implanted thereto is arranged. The semiconductor wafer CHW is placed in the space PCHI inside the process chamber PCH in such a manner that its first main surface is opposed to the main surface of the lamp RP and its second main surface is opposed to the main surface of the radiation thermometer TSN.

The lamp voltages Vcm(0) to Vcm(14) are supplied to the halogen lamps forming the lamp RP, thereby each halogen lamp emits light. This light is radiated to the semiconductor wafer (an object to be processed) CHW, so that the semiconductor wafer CHW is heated. The thermometers TSN(0) to TSN(6) forming the radiation thermometer TSN respectively measure temperatures in corresponding regions of the semiconductor wafer CHW and output the measurement results as the temperature detection signals TSS(0) to TSS(6).

Each of the temperature detection signals TSS(0) to TSS(6), the lamp-state voltages Vcm(0) to Vcm(14) output from the halogen lamps, the pressure detection signal PSS, and the flow-rate detection signal GSS is a signal that changes with time. That is, these signals are analog signals. These signals (the temperature detection signals TSS(0) to TSS(6), the lamp-state voltages Vcm(0) to Vcm(14) output from the halogen lamps, the pressure detection signal PSS, and the flow-rate detection signal GSS), that are analog signals, are supplied to the first computer FEPC. Also, among these signals, the temperature detection signals TSS(0) to TSS(6) and the lamp-state voltages Vcm(0) to Vcm(14) output from the halogen lamps are supplied to the second computer EEPC. The first computer FEPC and the second computer EEPC sample these analog signals supplied thereto to convert digital signals, and process the digital signals.

In this first embodiment, the temperature detection signals TSS(0) to TSS(6) and the lamp-state voltages Vcm(0) to Vcm(14) output from the halogen lamps are supplied to the first computer FEPC and the second computer EEPC and are sampled in each of those computers. However, the present invention is not limited thereto. In the first embodiment, sampling frequencies in sampling of these signals are set to be the same in the first computer FEPC and the second computer EEPC. Therefore, these signals may be sampled in the first computer FEPC, for example, to supply information (temperature information and heat-generation-source information) obtained by the sampling from the first computer FEPC to the second computer EEPC. Also, sampling of these signals may be performed by a different device from the first computer FEPC and the second computer EEPC to supply the information (the temperature information and the heat-generation-source information) obtained by the sampling to the first computer FEPC and the second computer EEPC.

<Spike Annealing>

Figure 3:
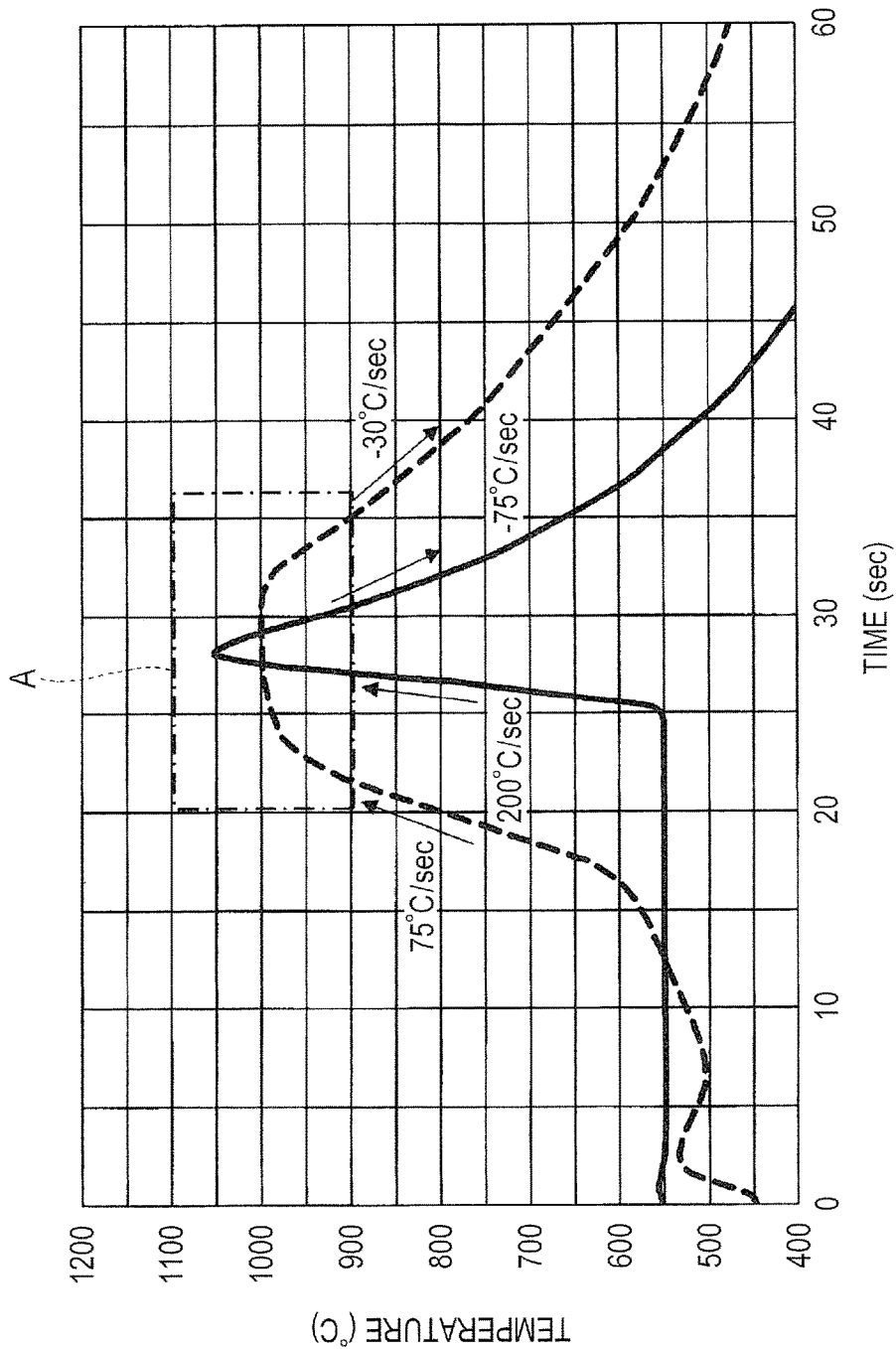
FIG. 3 is a characteristic diagram showing a temperature change in common RTP annealing and a temperature change in spike annealing.

Here, characteristics of the spike annealing device 1 are described. FIG. 3 is a characteristic diagram showing a temperature change by a common RTP annealing method and a temperature change by spike annealing. In FIG. 3, the horizontal axis represents time and the vertical axis represents a temperature. Also, in FIG. 3, broken line shows the temperature change by the common RTP annealing method, and solid line shows the temperature change by spike annealing. In the common RTP annealing method, the temperature increases at a rate of 75° C./second in heating and decreases at a rate of −30° C./second in cooling, for example. Meanwhile, in spike annealing, the temperature increases at a rate of 200° C./second in heating and decreases at a rate of −75° C./second in cooling, for example.

Figure 4:
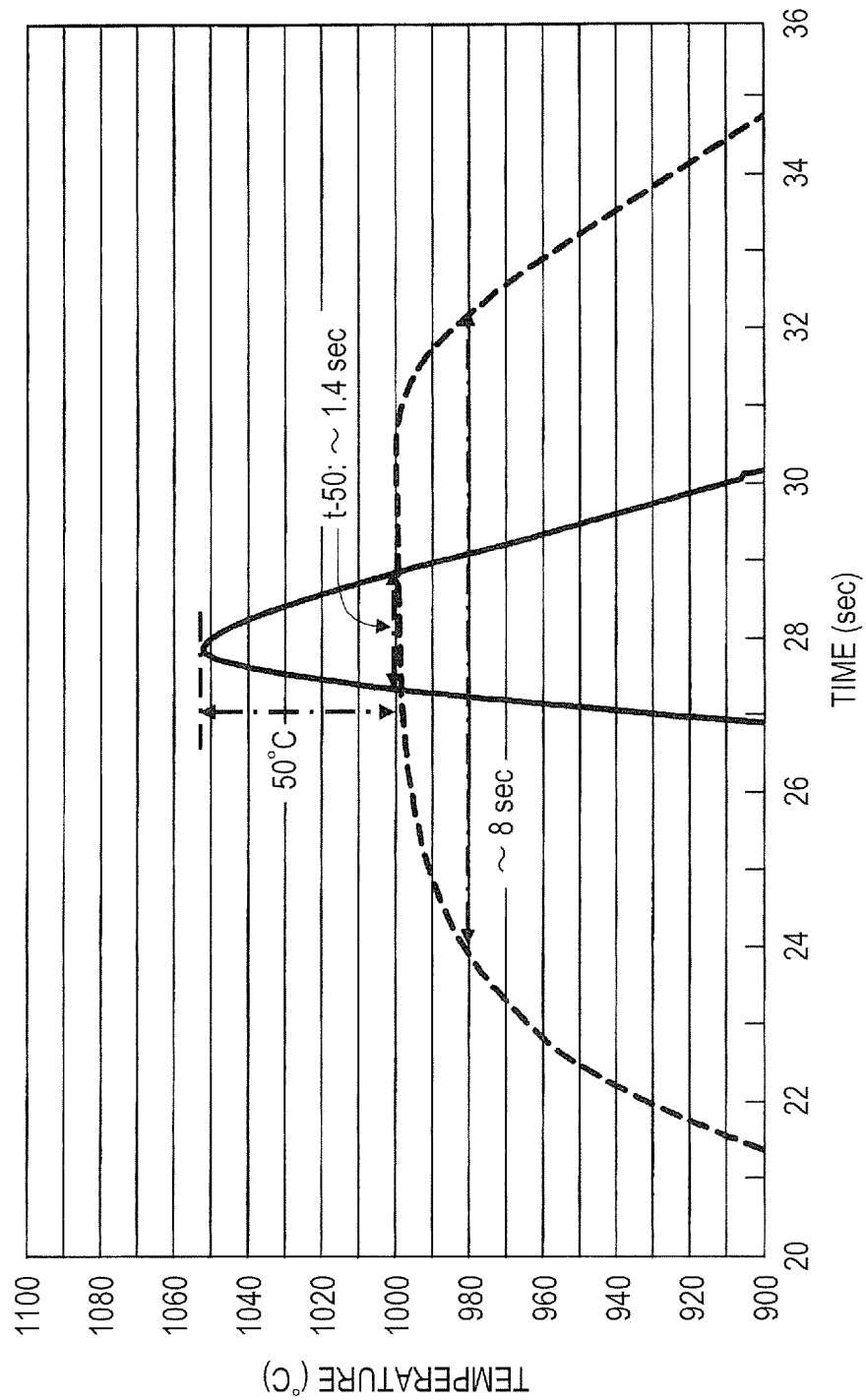
FIG. 4 is a characteristic diagram obtained by enlarging a region A in the characteristics shown in FIG. 3, surrounded by dashed dotted line.

FIG. 4 is a characteristics diagram obtained by enlarging a region A in FIG. 3 surrounded by dashed dotted line, for showing a difference between the common RTP annealing method and spike annealing in more detail. Because the region A in FIG. 3 is enlarged, the horizontal axis in FIG. 4 represents the time and the vertical axis represents the temperature.

In FIG. 4, in spike annealing, the temperature reaches the highest temperature (around 1050° C.) at about 28 seconds. In FIG. 4, t-50 shows a time in which the temperature increases from a predetermined temperature to the highest temperature by heating and then decreases to the predetermined temperature again by cooling. In FIG. 4, a temperature lower than the highest temperature by 50° C. is set to the predetermined temperature. Therefore, the time t-50 is a time in which the temperature is increased by heating by light emission of the lamp from a temperature (about 1000° C.) that is lower than the highest temperature (about 1050° C.) by 50° C. and is then decreased to reach the predetermined temperature (about 1000° C.) from the highest temperature by cooling. In spike annealing, the time t-50 is about 1.4 seconds, for example. Meanwhile, in the common RTP annealing method, the highest temperature is about 1000° C., and it takes about 8 seconds, for example, to increase the temperature from a temperature (about 980° C.) that is lower than the highest temperature by 20° C. to the highest temperature and to decrease the temperature to about 980° C. again, for example.

Activation of impurities and recovery of crystal defects are achieved by annealing. However, as the time of heating is longer, the implanted impurities are diffused and the impurity region expands, causing a change of characteristics of a MOSFET or the like. In spike annealing, the time t-50 is shorter and heating (increasing the temperature) and cooling (decreasing the temperature) can be performed in a shorter time period, as compared with the common RTP annealing method, as shown in FIG. 4. Thus, spike annealing can suppress the change of the characteristics of the MOSFET or the like. Because the temperature increase and the temperature decrease occur in a short time in spike annealing, annealing is performed in a transitional manner. In order to find an annealing state in the spike annealing device 1, monitoring of the transitional annealing is required.

Figure 5:
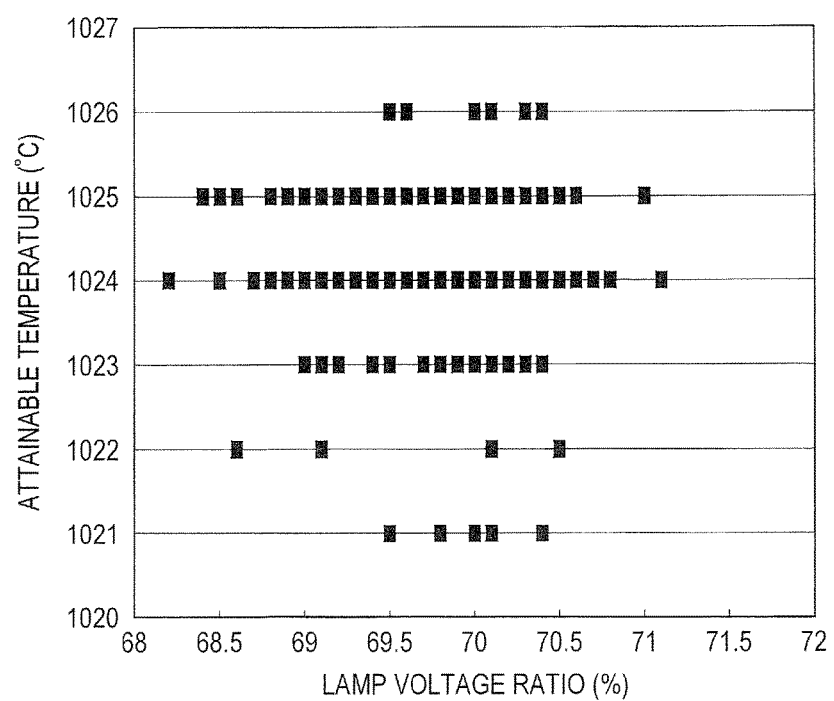
FIG. 5 is a distribution diagram showing a relation between a lamp voltage and an attainable temperature in spike annealing.

FIG. 5 is a distribution diagram showing a relation between the lamp voltage and an attainable temperature in spike annealing. In FIG. 5, the horizontal axis represents a voltage ratio of the lamp (a lamp voltage ratio) and the vertical axis represents the attainable temperature. The lamp voltage ratio represented on the horizontal axis shows a ratio when a maximum voltage the spike annealing device 1 can supply to the lamp is assumed to be 100%. For example, 70 on the horizontal axis shows that 70% of the maximum voltage is supplied to the lamp. In FIG. 5, the attainable temperatures are plotted for the lamp voltages from about 68% to about 72%. Also, the attainable temperatures are plotted while the position of a heated semiconductor wafer or/and the position of a lamp emitting light is changed. As is understood from FIG. 5, temperatures to be attained (attainable temperatures) are different even when the lamp voltage ratio is the same, and the lamp voltage ratio and the attainable temperature attained by that lamp voltage ratio have no correlation therebetween. Therefore, this shows that it is difficult to find the attainable temperature based on the lamp voltage.

<Configuration of Lamp RP>

Figure 6:
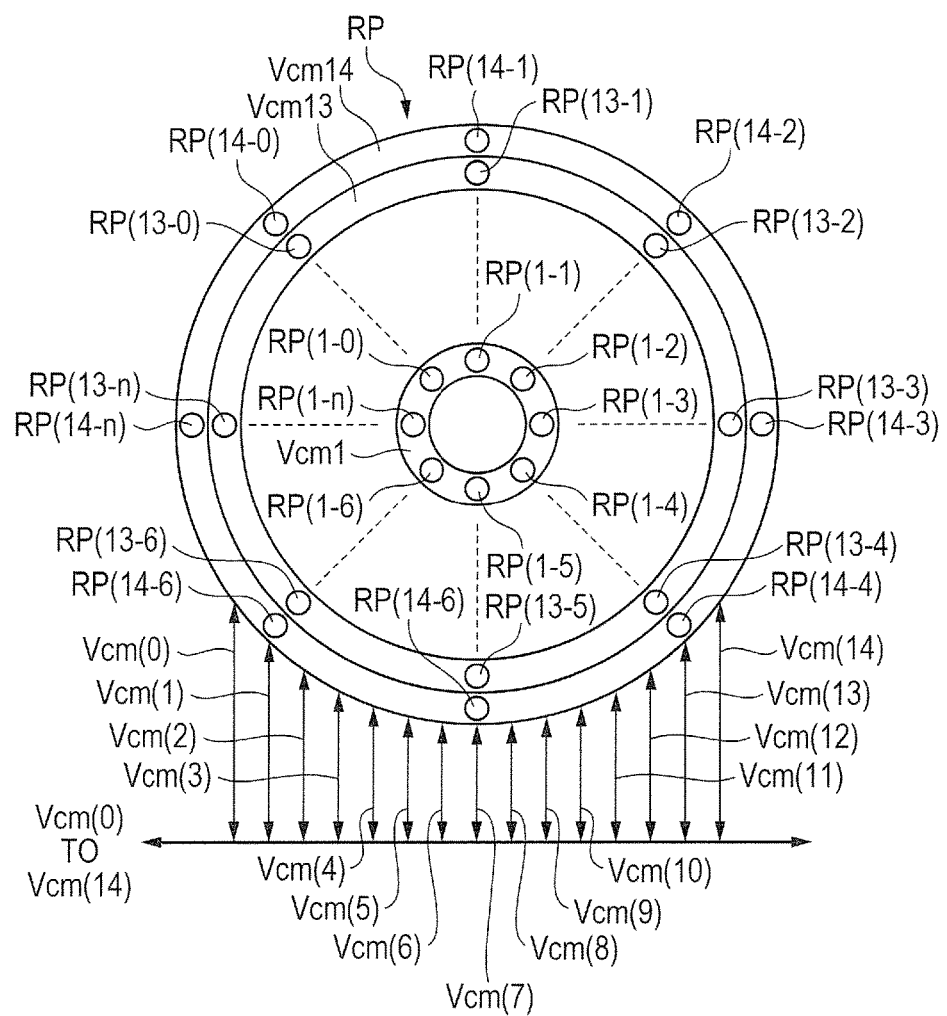
FIG. 6 is a plan view showing a configuration example of a lamp according to the first embodiment.

FIG. 6 is a plan view showing a configuration example of the lamp RP according to the first embodiment. As described in FIG. 2, the lamp RP includes a plurality of halogen lamps. FIG. 6 shows halogen lamps RP(1-0) to RP(1-$n$), RP(13-0) to RP(13-$n$), and RP(14-0) to RP(14-$n$) as typical ones of those halogen lamps. The lamp RP has a plurality of zones respectively assigned to mutually different positions. In each zone, a plurality of halogen lamps are arranged. In FIG. 6, 15 concentric circles that are mutually different in radius are assigned as zones Vcm0 to Vcm14, although the zones are not specifically limited. In FIG. 6, three zones Vcm1, Vcm13, and Vcm14 of these 15 zones Vcm0 to Vcm14 are shown as an example. The remaining 12 zones (Vcm0 and Vcm2 to Vcm12), that are not shown, are also assigned to concentric circles having different radii, respectively, and a plurality of halogen lamps are arranged in each of the assigned zones.

Each zone is provided with a plurality of halogen lamps arranged at mutually different positions. The description is made referring to the zones Vcm1, Vcm13, and Vcm14 shown in FIG. 6 as an example. The zone Vcm1 is provided with the halogen lamps RP(1-0) to RP(1-$n$) arranged on the same one of the concentric circles at mutually different positions. The zone Vcm13 is provided with the halogen lamps RP(13-0) to RP(13-$n$) arranged on the same one of the concentric circles at mutually different positions. The zone Vcm14 is provided with the halogen lamps RP(14-0) to RP(14-$n$) arranged on the same one of the concentric circles at mutually different positions. This is the same for the remaining zones Vcm0 and Vcm2 to Vcm12.

The halogen lamps arranged in the same zone are handled as one unit. That is, the same lamp voltage is supplied to the halogen lamps arranged in the same zone, and one lamp-state voltage is formed by the halogen lamps. In the example shown in FIG. 6, the halogen lamps RP(1-0) to RP(1-$n$) arranged in the zone Vcm1 are handled as one unit, and the same lamp voltage is supplied to these halogen lamps RP(1-0) to RP(1-$n$). Also, one lamp-state voltage is formed by these halogen lamps RP(1-0) to RP(1-$n$). As in FIG. 2, the lamp voltage supplied to the halogen lamps RP(1-0) to RP(1-$n$) and the lamp-state voltage are collectively shown as a lamp voltage Vcm(1) in FIG. 6.

Similarly, the halogen lamps RP(13-0) to RP(13-$n$) arranged in the zone Vcm13 are handled as one unit, and the same lamp voltage is supplied to these halogen lamps RP(13-0) to RP(13-$n$). One lamp-state voltage is formed by these halogen lamps. This lamp voltage and the lamp-state voltage are shown as a voltage Vcm(13) in FIG. 6. Further, the halogen lamps RP(14-0) to RP(14-$n$) arranged in the zone Vcm14 are handled as one unit, and the same lamp voltage is supplied to these halogen lamps RP(14-0) to RP(14-$n$). One lamp-state voltage is formed by these halogen lamps. This lamp voltage and the lamp-state voltage are shown as a voltage Vcm(14) in FIG. 6. The halogen lamps arranged in each of the remaining zones Vcm0 and Vcm2 to Vcm12 are also handled as one unit. In the respective zones Vcm0 and Vcm2 to Vcm 12, corresponding voltages Vcm(0) and Vcm(2) to Vcm(12) are supplied as lamp voltages and are output as lamp-state voltages.

Figure 7A:
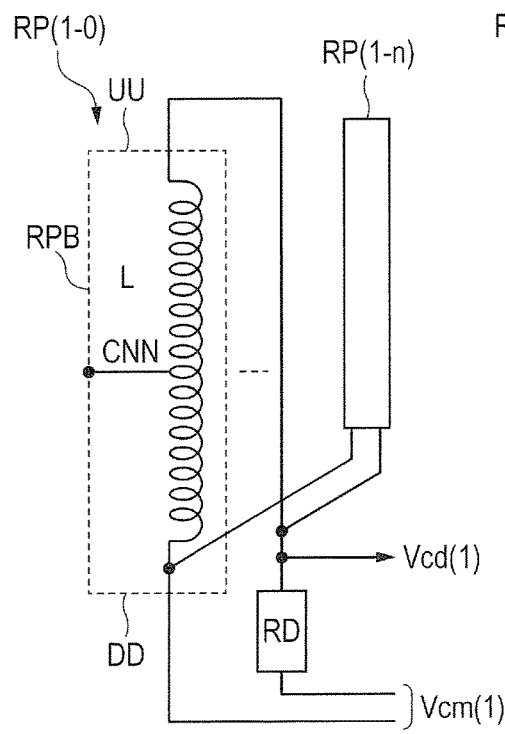
FIGS. 7A and 7B are circuit diagrams showing the configuration of the lamp according to the first example.
Figure 7B:
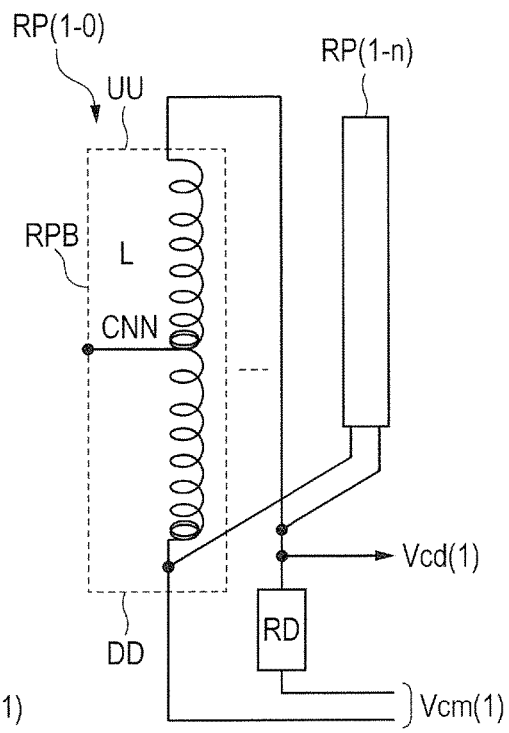

FIGS. 7A and 7B are circuit diagrams showing the configuration of the lamp RP according to the first embodiment. FIGS. 7A and 7B show the configuration of the halogen lamp arranged in the zone Vcm1. FIG. 7B will be descried later, and is therefore not described here.

FIG. 7A shows the configuration of the halogen lamp RP(1-0). Because the other halogen lamps RP(1-1) to RP(1-$n$) have the same configuration, the halogen lamp RP(1-0) is described here as an example. Broken line RPB shows a housing of the halogen lamp. A conductive wire wound like a coil forms a filament L. The filament L is sealed in the housing RPB with a predetermined gas, and emits light when the lamp voltage Vcm(1) is supplied to both ends of the filament L. In this first embodiment, a predetermined portion of the filament L, for example, a central portion of the filament L, is fixed to the housing RPB of the halogen lamp RP(1-0) by a supporting member CNN. With this configuration, the filament L is fixed to the housing RPB at its central portion and both ends of UU and DD of the housing RPB.

The halogen lamps RP(1-0) to RP(1-$n$) arranged in the same zone Vcm1 are coupled in parallel, although not specifically limited. That is, filaments L in the respective halogen lamps are coupled in parallel to each other. The zone Vcm1 is provided with a resistor device RD for generating the lamp-state voltage, although not specifically limited. One terminals of the respective halogen lamps RP(1-0) to RP(1-$n$) are coupled in common, and are further coupled to the resistor device RD. The lamp voltage Vcm(1) is supplied to the one terminals of the halogen lamps RP(1-0) to RP(1-$n$) via this resistor device RD. To the other terminals of the respective halogen lamps RP(1-0) to RP(1-$n$), a ground voltage is supplied, for example. The ground voltage may be supplied to the one terminals via the resistor device RD, while the lamp voltage Vcm(1) is supplied to the other terminals.

In accordance with states of the halogen lamps, a current flowing through the resistor device RD changes. This results in a change of a voltage drop generated in the resistor device RD, and therefore the voltage drop generated in the resistor device RD is obtained as the lamp-state voltage Vcd(1).

Due to this, the halogen lamps RP(1-0) to RP(1-$n$) arranged in the zone Vcm1 can be handled as one unit.

The example in which the resistor device RD is provided is shown for explaining a concept for finding the states of the halogen lamps. However, the states of the halogen lamps can be found without providing the resistor device RD. For example, when the lamp voltage Vcm(1) is formed by a voltage source that can supply a predetermined constant current, the lamp voltage Vcm(1) can be used as the lamp-state voltage Vcd(1). In this case, the lamp voltage Vcm(1) decreases when the current supplied from the voltage source to the halogen lamps RP(1-0) to RP(1-$n$) handled as one unit becomes larger, and increases when the supplied current becomes smaller. Thus, it is possible to detect the states of the halogen lamps RP(1-0) to RP(1-$n$) by monitoring the lamp voltage Vcm(1).

In the following description, a case is described in which the states of the halogen lamps are monitored by monitoring the lamp voltage Vcm(1), not by monitoring the lamp-state voltage Vcd (1) generated by the voltage drop in the resistor device RD. By doing this, it is possible to reduce power consumption in the resistor device RD. Of course, the lamp-state voltage may be generated by using the resistor RD to monitor the states of the halogen lamps based on the generated lamp-state voltage.

The halogen lamps arranged in the other zones Vcm0 and Vcm2 to Vcm14 are the same as those in the zone Vcm1. That is, the halogen lamps arranged in the same zone are coupled in parallel to each other, and a corresponding one of the lamp voltages Vcm(0) and Vcm(2) to Vcm(14) is supplied to the halogen lamps coupled in parallel. Also, based on this lamp voltage Vcm(0), Vcm(2) to Vcm(14), the states of the corresponding halogen lamps are monitored.

One of the concentric circles is described as one zone. However, the present invention is not limited thereto. For example, instead of the concentric circles, the main surface of the lamp RP, opposed to the placed semiconductor wafer CHW, may be divided into a plurality of small regions which are respectively used as the zones.

<Configuration of Radiation Thermometer>

Figure 8:
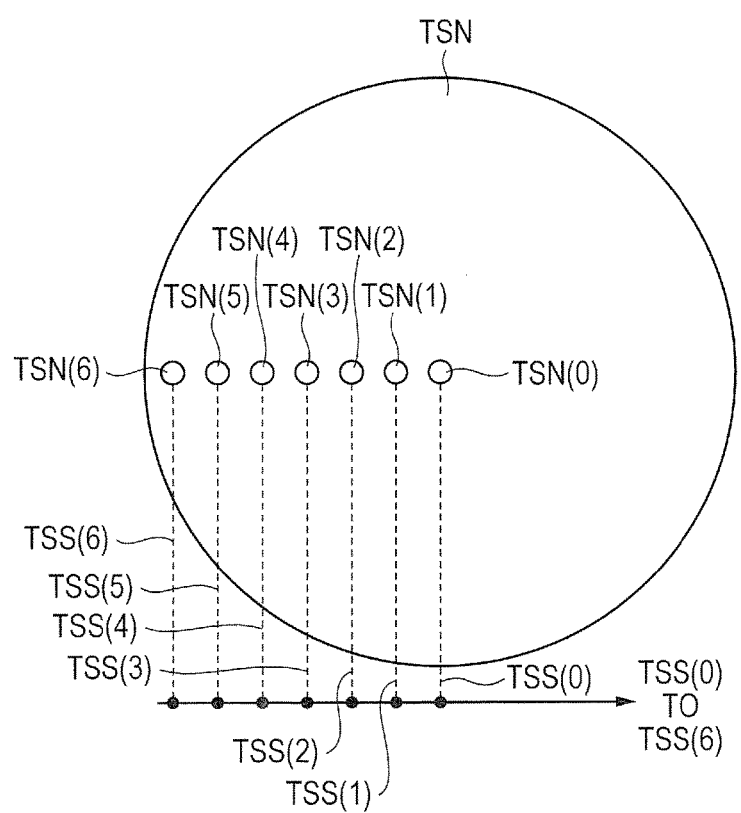
FIG. 8 is a plan view showing a configuration of a radiation thermometer according to the first embodiment.

FIG. 8 is a plan view showing a configuration of the radiation thermometer TSN according to the first embodiment. In this first embodiment, the radiation thermometer TSN includes seven thermometers TSN(0) to TSN(6) arranged in one line, although not specifically limited. The thermometers TSN(0) to TSN(6) respectively output temperature detection signals TSS(0) to TSS(6) in accordance with temperatures in regions of a semiconductor wafer that are opposed thereto.

The number of the thermometers is not limited to seven, but can be a number less than seven or a number larger than seven. Further, it is not necessary that the thermometers are arranged in one line.

<First Computer FEPC and Second Computer EEPC>

Figure 9:
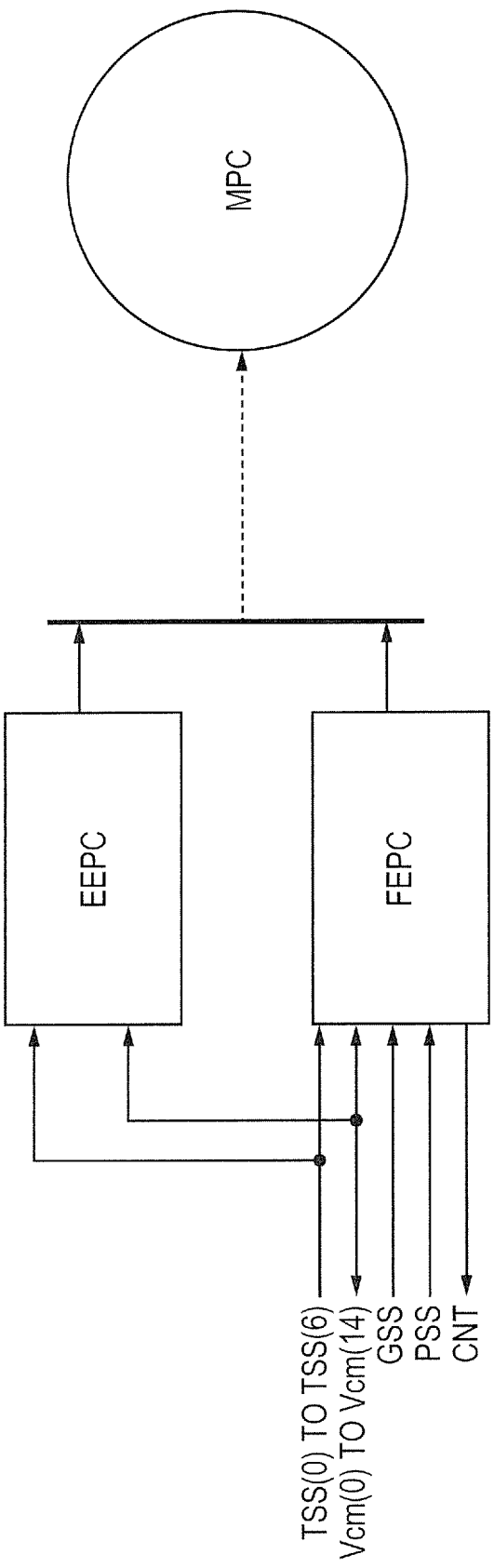
FIG. 9 is a block diagram of a computer according to the first embodiment.

FIG. 9 is a block diagram showing a configuration of a computer according to the first embodiment. As described in FIG. 2, the first computer FEPC and the second computer EEPC are coupled to the spike annealing device 1 according to the first embodiment. The outline of the first computer FEPC and the second computer EEPC is described, referring to FIG. 9.

The first computer FEPC receives temperature detection signals TSS(0) to TSS(6), a flow-rate detection signal GSS, a pressure detection signal PSS, and lamp voltages Vcm(0) to Vcm(14), described in FIG. 2 and the like, and controls the spike annealing device 1. Also, the first computer FEPC generates information related to the spike annealing device 1, represented by a statistic value, and provides the generated information to the management computer MPC installed in a factory. Meanwhile, the second computer EEPC receives the temperature detection signals TSS(0) to TSS(6) and the lamp voltages Vcm(0) to Vcm(14), and generates information related to the state of the lamp RP based on these signals and provides the generated information to the management computer MPC.

Figure 10:
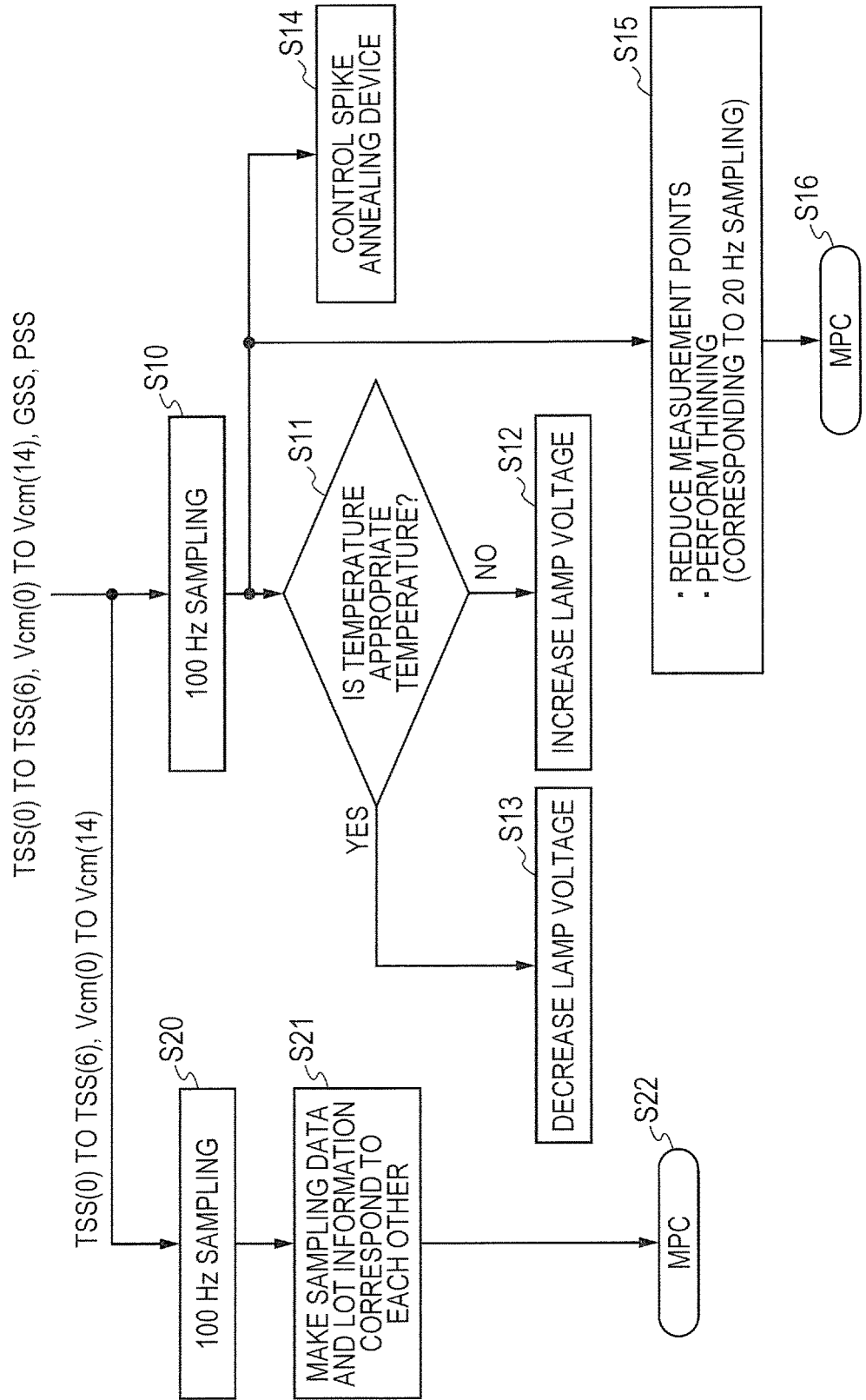
FIG. 10 is a flowchart describing functions of a first computer and a second computer according to the first embodiment.

FIG. 10 is a flowchart describing functions of the first computer FEPC and the second computer EEPC according to the first embodiment. In FIG. 10, the right portion shows the function of the first computer FEPC, while the left portion shows the function of the second computer EEPC.

Figure 11:
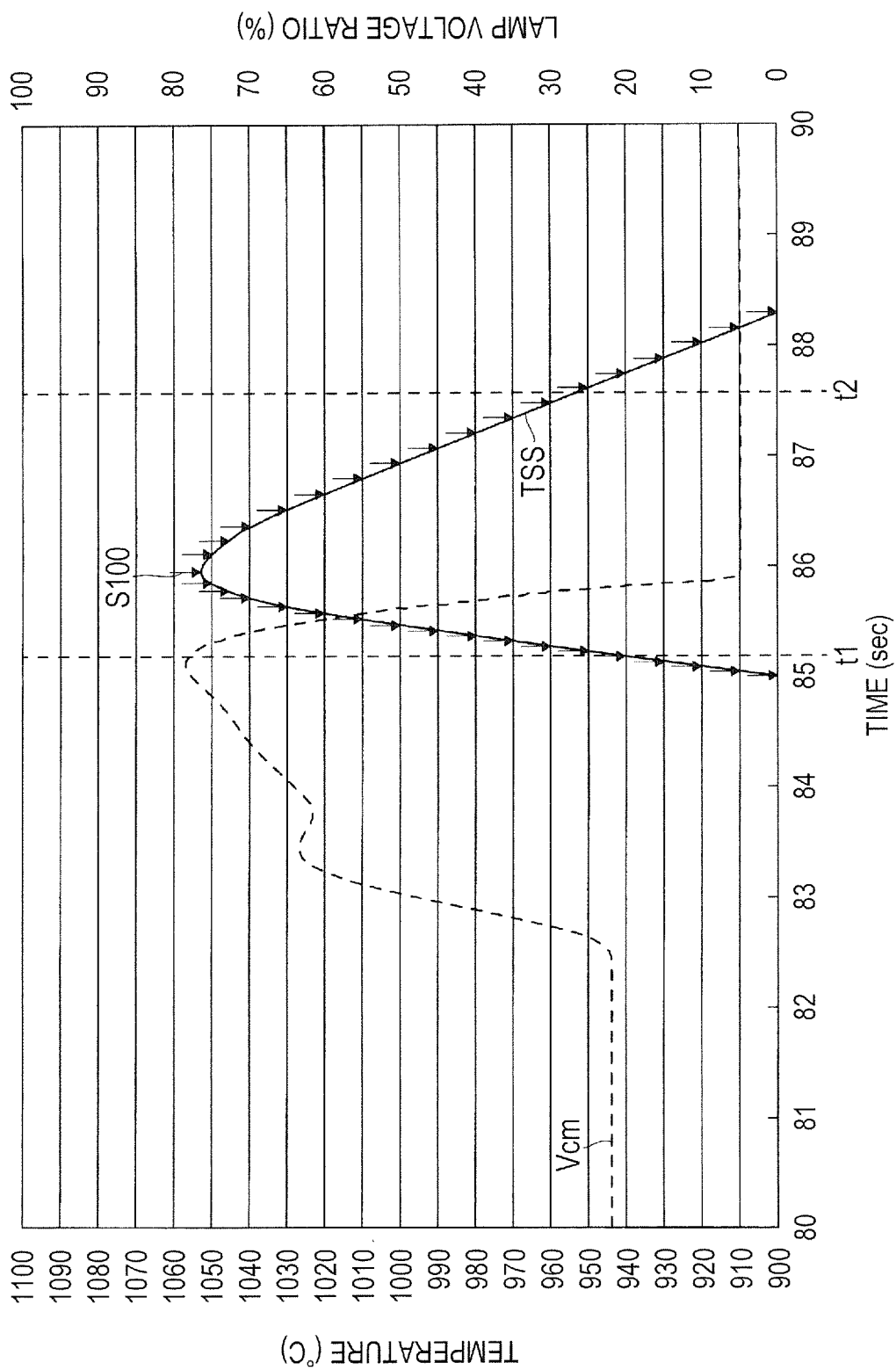
FIG. 11 is a waveform chart showing waveforms of a temperature detection signal and a lamp voltage according to the first embodiment.

FIG. 11 is a waveform chart showing waveforms of the temperature detection signal TSS and the lamp voltage Vcm according to the first embodiment. For generalized explanation of the lamp voltage, the lamp voltage Vcm is represented as a lamp voltage ratio in FIG. 11. That is, the waveform of the lamp voltage Vcm is represented as a ratio to a lamp voltage that the spike annealing device 1 can output. In FIG. 11, the horizontal axis represents time, the vertical axis in the left portion represents a temperature, and the vertical axis in the right portion represents the lamp voltage ratio.

Because the waveform of the lamp voltage Vcm and the waveform of the lamp voltage ratio are similar, the waveform of the lamp voltage ratio is also described as the waveform of the lamp voltage Vcm in this specification in some cases.

In FIG. 11, the waveform of the lamp voltage Vcm (the lamp voltage ratio) is shown with broken line, and the waveform of the temperature detection signal TSS is shown with solid line. When the value of the lamp voltage (the lamp voltage ratio) is read, the lamp voltage ratio indicated on the right vertical axis is referred to. When the value of the temperature detection signal is read, the temperature indicated on the left vertical axis is referred to.

FIG. 11 shows a waveform of a lamp voltage (Vcm(14)) corresponding to a specific one (for example, Vcm14) of the zones described before and a waveform of a temperature detection signal (TSS(6)) from a thermometer (for example, TSN(6)) corresponding to a region heated by a plurality of halogen lamps (RP(14-0) to RP(14-n)) arranged in this specific zone. Further, in FIG. 11, solid arrows added to the temperature detection signal TSS(TSS(6)) indicate sampling timings at which the first computer FEPC and the second computer EEPC sample the temperature detection signal TSS(TSS(6)). For avoiding the drawing from becoming complicated, only one sampling timing is labeled with sign S100 in FIG. 11, and the sign S100 is omitted for the remaining sampling timings. In the first embodiment, each of the first computer FEPC and the second computer EEPC samples the temperature detection signal TSS (TSS(6)) at 100 Hz. That is, the sampling timing S100 occurs at a time interval of 10 ms.

Although the temperature detection signal TSS(6) has been described as an example, each of the first computer FEPC and the second computer EEPC also samples the remaining temperature detection signals TSS(0) to TSS(5) at 100 Hz. Further, the first computer FEPC samples not only the temperature detection signals TSS(0) to TSS(6) but also each of the flow-rate detection signal GSS, the pressure detection signal PSS, and the lamp voltages Vcm(0) to Vcm(14) at 100 Hz. Meanwhile, the second computer EEPC samples not only the temperature detection signals TSS(0) to TSS(6) but also the lamp voltages Vcm(0) to Vcm(14) at 100 Hz.

First, the function of the first computer FEPC is described. To the first computer FEPC, the temperature detection signals TSS(0) to TSS(6), the lamp voltages Vcm(0) to Vcm(14), the flow-rate detection signal GSS, and the pressure detection signal PSS are supplied. The first computer FEPC samples these signals and these voltages at 100 Hz in Step S10 to convert them to digital signals.

As shown in FIG. 11, by increasing the lamp voltage Vcm(14), light emission from the halogen lamps RP(14-0) to RP(14-n) arranged in the zone Vcm14 become stronger, and the temperature increases. With this temperature increase, the temperature detection signal TSS(6) from the thermometer TSN(6) also increases. The temperature detection signal TSS(6) is sampled at 100 Hz, and the first computer FEPC determines, based on temperature information obtained by the sampling, whether the temperature reaches an appropriate temperature (for example, the highest temperature) in Step S11. When it has been determined in Step S11 that the temperature has not reached the appropriate temperature, the lamp voltage Vcm(14) is increased in Step S12. When it has been determined in Step S11 that the temperature has reached the appropriate temperature, Step S13 is performed. In Step S13, the lamp voltage Vcm(14) is decreased.

Steps S11 and S12 are repeated until the temperature information obtained by the sampling indicates the appropriate temperature (the highest temperature). That is, feedback control is performed at a time interval that is as short as about 10 ms in such a manner that the temperature of the zone Vcm14 reaches the appropriate temperature. When the temperature has reached the appropriate temperature, Step 13 is performed, so that the temperature is decreased. In this manner, even when the lamp voltage (the lamp voltage ratio) and the attainable temperature have no correlation therebetween as described in FIG. 5, it is possible to perform control to attain the appropriate temperature.

The first computer FEPC controls the spike annealing device 1 in Step S14. In Step 10, the flow-rate detection signal GSS and the pressure detection signal PSS are also sampled at 100 Hz. Based on flow-rate detection information and pressure detection information obtained by this sampling, a gas flow rate is controlled in Step S14.

Further, the first computer FEPC converts the sampling results obtained in Step S10 into a statistic value in Step S15 and provides the statistic value to the management computer MPC. An example of conversion to the statistic value performed in Step S15 is as follows.

The sampling results obtained by sampling at 100 Hz are thinned out so that the thinned out results are similar to results of sampling at 20 Hz, for example. That is, the results of the sampling at 100 Hz are thinned out so that the temperature detection signals TSS(0) to TSS(6), the flow-rate detection signal GSS, the pressure detection signal PSS, and the lamp voltages Vcm(0) to Vcm(14) are substantially sampled at a time interval of about 50 ms. From the seven temperature detection signal TSS(0) to TSS(6) that have been thinned out, only typical three temperature detection results (for example, TSS(0), TSS(4), and TSS(6)) are chosen. Further, an average value of the thinned out lamp voltages Vcm(0) to Vcm(14) is obtained. The average value in this case is a maximum value, a minimum value, and an average value of a plurality of average values in a predetermined period, for example. The flow-rate detection information and the pressure detection information obtained by thinning out, the chosen three temperature detection results, and the average value of the lamp voltages are provided to the management computer MPC as the statistic value (S16).

Meanwhile, as shown in the left portion of FIG. 10, the second computer EEPC samples the temperature detection signals TSS(0) to TSS(6) and the lamp voltages Vcm(0) to Vcm(14) at 100 Hz in Step S20, as in Step S10. Seven pieces of temperature detection information respectively corresponding to the temperature detection signals TSS(0) to TSS(6) obtained by the sampling and 15 pieces of heat-generation-source information respectively corresponding to the lamp voltages Vcm(0) to Vcm(14) obtained by the sampling are made to correspond to lot information in Step S21. That is, information is formed in the second computer EEPC based on the seven pieces of temperature detection information, the 15 pieces of heat-generation-source information, and the lot information, and is provided to the management computer MPC (S22). The lot information described here is information for specifying a wafer subjected to annealing. A plurality of wafers accommodated in a cassette placed on the load port RLP (FIG. 1) are handled as one lot in this first embodiment, although not specifically limited. Therefore, information on the cassette is associated with the seven pieces of temperature detection information and the 15 pieces of heat-generation-source information in Step S21 and is provided to the management computer MPC.

In this first embodiment, information provided from the second computer EEPC to the management computer MPC includes the temperature detection information and the heat-generation-source information that have been obtained by sampling at a time interval that is as short as 10 ms. Further, respective sampling results of all the thermometers TSN(0) to TSN(6) are provided as the temperature detection information, and results of sampling corresponding to all the zones Vcm0 to Vcm14 are provided as the pieces of heat-generation-source information, respectively. Therefore, by using the information formed in the second computer EEPC, it is possible to monitor the transitional change of the temperature in spike annealing described in FIG. 4. Also, it is possible to monitor a transitional change of the halogen lamp.

Further, because the pieces of heat-generation-source information in all the zones and the pieces of temperature detection information from all the thermometers are provided, the states of the halogen lamps can be surely monitored on a zone-by-zone basis.

<Monitoring of Disconnection of Halogen Lamp>

Figure 12:
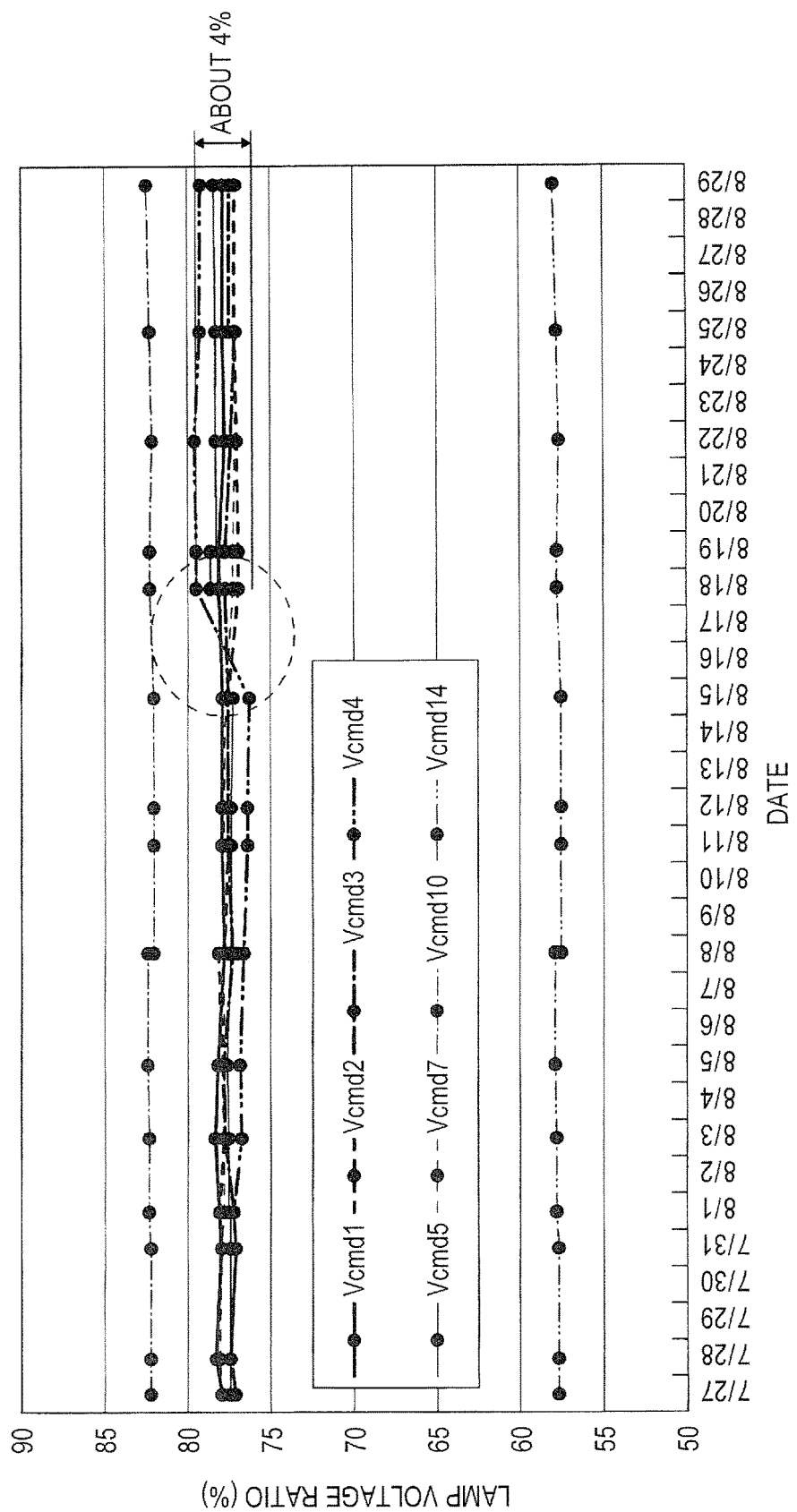
FIG. 12 is a waveform chart showing a change of the lamp voltage with time according to the first embodiment.

FIG. 12 is a waveform chart showing a change of a lamp voltage (a lamp voltage ratio) with time according to the first embodiment. FIG. 12 is a waveform chart created by plotting the pieces of heat-generation-source information obtained by 100 Hz sampling of the lamp voltages Vcm(0) to Vcm(14) in the second computer EEPC in Step S20 for a predetermined period (from July 21 to August 29). The waveform shown in FIG. 12 may be created by the management computer MPC by using the information provided from the second computer EEPC to the management computer MPC, or may be created by the second computer EEPC by using the information to be provided to the management computer MPC.

For easier explanation, the following description is made, assuming that the pieces of heat-generation-source information obtained by 100 Hz sampling of the lamp voltages Vcm(0) to Vcm(14) are Vcmd0 to Vcmd14. In FIG. 12, the horizontal axis represents a date and the vertical axis represents the lamp voltage ratio. In FIG. 12, plotted points are given only to dates on which the heat-generation-source information is acquired. Because the pieces of heat-generation-source information Vcmd0 to Vcmd14 are acquired by sampling the lamp voltages Vcm(0) to Vcm(14) at 100 Hz, respectively, the pieces of the heat-generation-source information correspond to the lamp voltages (the lamp voltage ratios), and a value of the heat-generation-source information can be found by referring to the lamp voltage (the lamp voltage ratio) represented on the vertical axis in FIG. 12.

A number of semiconductor wafers are subjected to annealing in one day. FIG. 12 shows, for one semiconductor wafer, heat-generation-source information in a specific zone. Although there are 15 zones in the first embodiment, FIG. 12 shows heat-generation-source information Vcmd1 corresponding to the zone Vcm1 with thick solid line, heat-generation-source information Vcmd2 corresponding to the zone Vcm2 with thick broken line, heat-generation-source information Vcmd3 corresponding to the zone Vcm3 with thick dashed dotted line, and heat-generation-source information Vcmd4 corresponding to the zone Vcm4 with thick dashed double-dotted line. Also, FIG. 12 shows heat-generation-source information Vcmd5 corresponding to the zone Vcm5 with thin solid line, heat-generation-source information Vcmd7 corresponding to the zone Vcm7 with thin broken line, heat-generation-source information Vcmd10 corresponding to the zone Vcm10 with thin dashed dotted line, heat-generation-source information Vcmd14 corresponding to the zone Vcm14 with thin dashed double-dotted line.

It is shown in FIG. 12 that the pieces of heat-generation-source information Vcmd1 to Vcmd3, Vcmd5, Vcmd7, Vcmd10, and Vcmd14 are approximately constant in the predetermined period. Meanwhile, the heat-generation-source information Vcmd14 gradually decreases, and then increases around August 17, as surrounded by a circle of broken line.

As described in FIG. 10, the first computer FEPC performs feedback control so that the temperature reaches an appropriate temperature (for example, the highest temperature). Therefore, when the filament L of one of a plurality of halogen lamps arranged in the same zone is disconnected, for example, the lamp voltage increases so that the temperature is increased to the appropriate temperature by the remaining halogen lamps arranged in the same zone. The heat-generation-source information is obtained by sampling of the lamp voltage at 100 Hz. Therefore, disconnection occurs in a halogen lamp arranged in a zone, heat-generation-source information (a lamp voltage) corresponding to that zone increases. Thus, the second computer EEPC can detect disconnection of the halogen lamp and specify the zone (the zone unit) in which the disconnected halogen lamp is arranged, by monitoring the pieces of heat-generation-source information corresponding to the respective zones. In the example of FIG. 12, it is possible to specify that disconnection of a halogen lamp occurred on August 17 and the disconnected halogen lamp is arranged in the zone Vcm4.

Although the above description has been made referring to the zone Vcm4 as an example, the second computer EEPC can detect and specify disconnection of a halogen lamp in any zone because the second computer EEPC includes the pieces of heat-generation-source information Vcmd0 to Vcmd14 corresponding to all the zones.

The example in which the second computer EEPC detects disconnection of a halogen lamp and specifies the disconnected halogen lamp has been described here. However, the present invention is not limited thereto. Because the information provided from the second computer EEPC to the management computer MPC includes all pieces of heat-generation-source information Vcmd0 to Vcmd14, as described in FIG. 10, the management computer MPC may create the waveform as shown in FIG. 12 to detect disconnection and specify the zone in which the disconnected halogen lamp is arranged.

Also from the first computer FEPC, the average value of the pieces of heat-generation-source information is supplied as the statistic value to the management computer MPC, as described in FIG. 10. Therefore, detection of disconnection of the halogen lamp using the average value of the pieces of heat-generation-source information can be considered. However, when a halogen lamp is disconnected and the heat-generation-source information (the lamp voltage) corresponding to the zone in which that disconnected halogen lamp is arranged is referred to, the magnitude of a change between before and after the disconnection is small. Referring to FIG. 12 as an example, the magnitude of the change between before and after the disconnection is as small as about 4% as the lamp voltage ratio. This magnitude of the change of 4% becomes further smaller in a case where 15 pieces of heat-generation-source information are averaged. Therefore, detection whether disconnection occurs is difficult. Further, because of the averaging, it is difficult to specify the zone including the disconnection.

In FIGS. 9 and 10, the example using the first computer FEPC and the second computer EEPC has been described. However, the present invention is not limited thereto. For example, the first computer FEPC may be configured by an temperature-management computer (labeled with O-PC for the sake of convenience, although not illustrated), a computer for controlling the spike annealing device (labeled with C-PC for the sake of convenience, although not illustrated), and a computer for managing the spike annealing device (labeled with FEPC1 for the sake of convenience, although not illustrated).

In this case, the temperature-management computer O-PC is made to perform the function of 100 Hz sampling described in FIG. 10 (Step S10) and the function of the feedback control (Steps S11 to S13). The computer C-PC for controlling the spike annealing device is made to perform the function of controlling the spike annealing device described in FIG. 10 (Step S14). In this case, the computer FEPC1 for managing the spike annealing device is made to perform Steps S15 and S16 shown in FIG. 10 and control the temperature-management computer O-PC and the computer C-PC for controlling the spike annealing device.

In this case, it suffices that the function of 100 Hz sampling is not provided in the second computer EEPC, and the temperature information and the heat-generation-source information obtained by 100 Hz sampling are supplied from the temperature-management computer O-PC.

Second Embodiment

Figure 13:
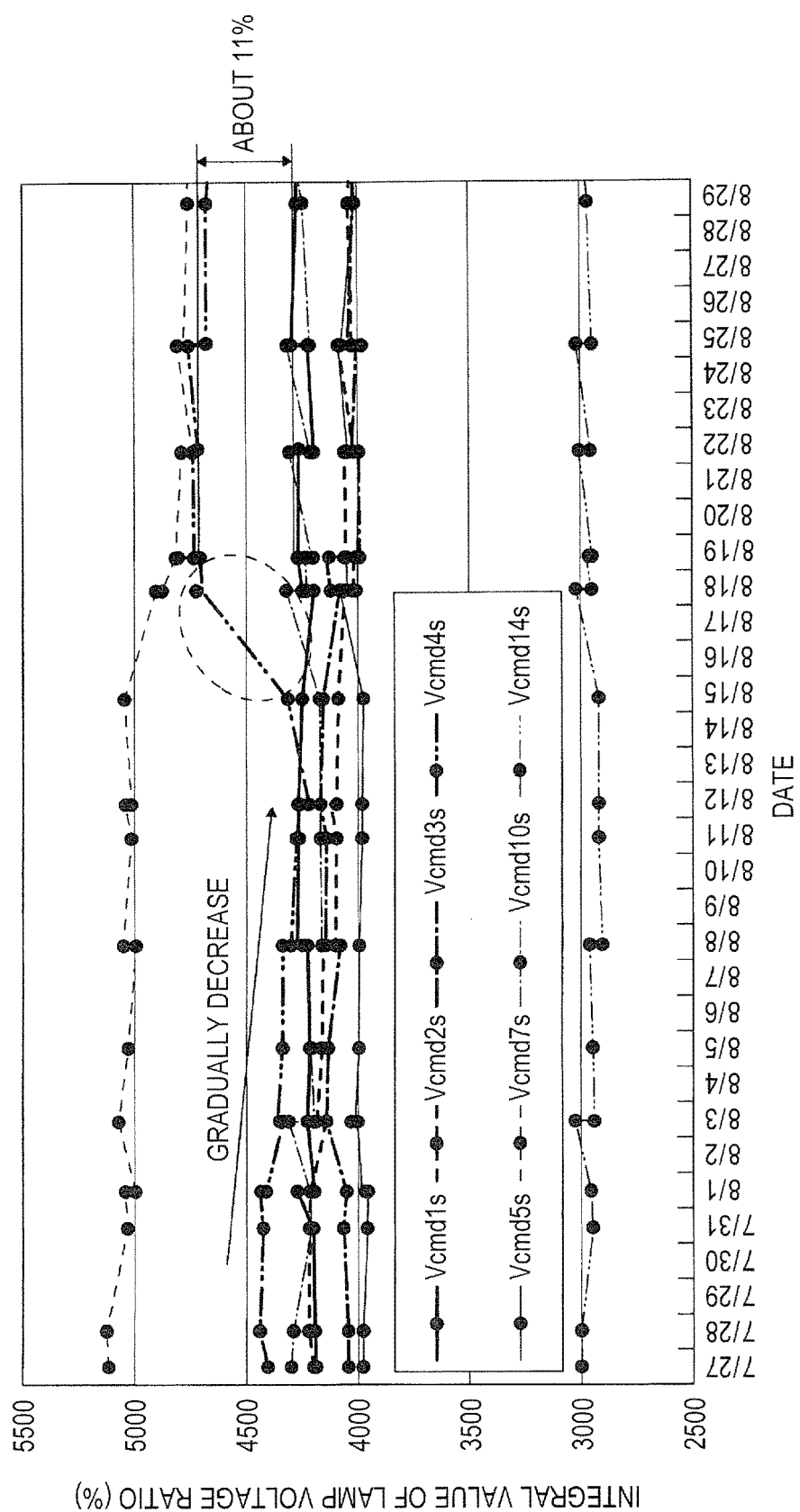
FIG. 13 is a waveform chart showing a change of a lamp voltage with time according to a second embodiment.

FIG. 13 is a waveform chart showing a change of a lamp voltage (a lamp voltage ratio) with time according to a second embodiment. FIG. 13 is similar to FIG. 12. Differences from FIG. 12 are mainly described here. The horizontal axis in FIG. 13 represents a predetermined period as in FIG. 12. Meanwhile, the vertical axis in FIG. 13 represents an integral value of the lamp voltage ratio. The integral value of the lamp voltage ratio is a value obtained by integration of the lamp voltage ratio for a period in which a temperature measured by a thermometer corresponding to a zone is a specific temperature or higher in this second embodiment. The integral value of the lamp voltage ratio is described below, referring to FIG. 11 as an example. In the second embodiment, the specific temperature (the first temperature) is 950° C. although it is not specifically limited.

In FIG. 11, a time at which the temperature reaches 950° C. or higher is a time t1 shown with broken line, and a time at which the temperature falls below 950° C. is a time t2 shown with broken line. The lamp voltage ratio for a period between the time t1 and the time t2 (between the broken lines, the first period) is integrated, so that the integral value of the lamp voltage ratio is obtained. In other words, the area of the waveform of the lamp voltage in the period between the time t1 and the time t2 is the integral value of the lamp voltage ratio.

The lamp voltages Vcm(0) to Vcm(14) are respectively sampled at 100 Hz to provide pieces of heat-generation-source information Vcmd0 to Vcmd14. Each integral value of the lamp voltage ratio is a value obtained by integration (or accumulation) of the pieces of heat-generation-source information Vcmd0 to Vcmd14 for the period in which corresponding temperature information indicates 950° C. or higher (from the time t1 to the time t2).

The integral value of the lamp voltage ratio is obtained for each of the zones Vcm0 to Vcm14. For easier explanation, the description is made, assuming that the integral values of the lamp voltage ratios respectively obtained for the zones Vcm0 to Vcm14 (integral values of the heat-generation-source information) are Vcmd0s to Vcmd14s. FIG. 13 shows the integral value of the lamp voltage ratio Vcmd1s corresponding to the zone Vcm1 with thick solid line, the integral value of the lamp voltage ratio Vcmd2s corresponding to the zone Vcm2 with thick broken line, the integral value of the lamp voltage ratio Vcmd3s corresponding to the zone Vcm3 with thick dashed dotted line, and the integral value of the lamp voltage ratio Vcmd4s corresponding to the zone Vcm4 with thick dashed double-dotted line. Further, FIG. 13 shows the integral value of the lamp voltage ratio Vcmd5s corresponding to the zone Vcm5 with thin solid line, the integral value of the lamp voltage ratio Vcmd7s corresponding to the zone Vcm7 with thin broken line, the integral value of the lamp voltage ratio Vcmd10s corresponding to the zone Vcm10 with thin dashed dotted line, and the integral value of the lamp voltage ratio Vcmd14s corresponding to the zone Vcm14 with thin dashed double-dotted line.

By integrating the lamp voltages (the lamp voltage ratios) Vcm(0) to Vcm(14) for the predetermined period, i.e., the period in which the temperatures of the corresponding zones are 950° C. or higher in this manner, it is possible to reveal the change of the lamp voltage.

Also in FIG. 13, the case where a halogen lamp arranged in the zone Vcm4 is disconnected is shown. It is shown in FIG. 13 that the integral values of the lamp voltage ratios (the integral values of the heat-generation-source information) Vcmd1s to Vcmd3s, Vcmd5s, Vcmd7s, Vcmd10s, and Vcmd14s are approximately constant or slightly decrease in the predetermined period. Meanwhile, the integral value of the lamp voltage ratio (the integral value of the heat-generation-source information) Vcmd4s gradually decreases and then suddenly increases around August 17, as surrounded by a circle of broken line. In this case, the magnitude of the change between before and after the increase reaches about 11%.

As described in FIG. 12, when a halogen lamp is disconnected, the lamp voltage (the lamp voltage ratio) of the zone in which that halogen lamp is arranged increases. Therefore, the integral value of the lamp voltage ratio (the integral value of the heat-generation-source information) also increases. Thus, by monitoring the integral value of the lamp voltage ratio (the integral value of the heat-generation-source information), occurrence of disconnection in the halogen lamp is detected and it is possible to specify that disconnection occurs in the halogen lamp arranged in the zone Vcm4. In addition, because the magnitude of the change between before and after disconnection becomes large in this second embodiment, it is possible to detect occurrence of the disconnection and specify the disconnection without fail.

The configuration of the halogen lamp is explained in FIG. 7A. When the halogen lamp is mounted in the lamp RP (FIG. 2), the halogen lamp is mounted in such a manner that one end portion of the housing RPB of the halogen lamp faces up and the other end portion faces down, for example. When the description is made referring to FIG. 7A as an example, the halogen lamp is mounted in such a manner that one end portion UU of the housing RPB faces up and the other end portion DD faces down. That is, the mounting is achieved to place one end portion DD closer to the radiation thermometer TSN than the other end portion UU. In this case, the filament L wound like a coil extends downwards by the action of gravity with time, i.e., with a change with time, and portions wound like the coil come into contact with each other as shown in FIG. 7B, so that a large current flows. Thereafter, disconnection occurs.

When the contact of the coil-like portions occurs because of the change with time and the large current flows, the lamp voltage (the lamp voltage ratio) is lowered. Thus, the lamp voltage (the lamp voltage ratio) Vcmd4 corresponding to the zone Vcm4 in which the halogen lamp that will be disconnected is arranged is slightly lowered before occurrence of disconnection, as shown in FIG. 12.

Figure 14:
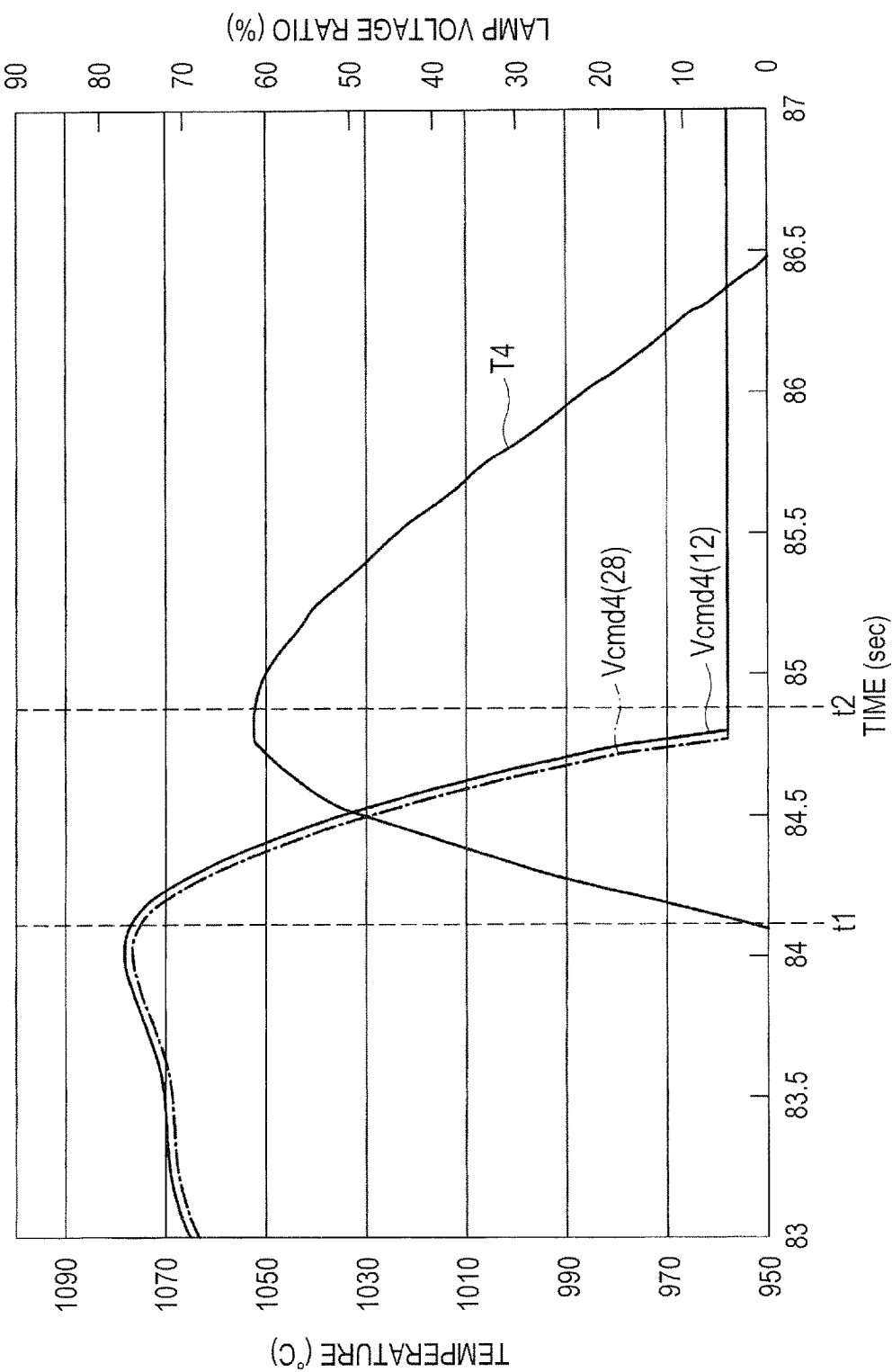
FIG. 14 is a waveform chart showing waveforms of the lamp voltage and a temperature detection signal according to the second embodiment.

FIG. 14 is a waveform chart showing the waveform of the lamp voltage Vcm(4) corresponding to the zone Vcm4 and a waveform of a temperature detection signal T4 from a thermometer corresponding to the zone Vcm4 according to the second embodiment. In FIG. 14, the horizontal axis represents time, the vertical axis in the left portion represents a temperature, and the vertical axis in the right portion represents the lamp voltage ratio, as in FIG. 11. As shown in FIGS. 12 and 13, a halogen lamp arranged in the zone Vcm4 is disconnected around August 17. Before that day, the lamp voltage corresponding to the zone Vcm4 is lowered. That is, in the halogen lamp arranged in the zone Vcm4, the filament L is deformed because of the change with time, as shown in FIG. 7B. Thus, a current flowing through the halogen lamp becomes larger, the corresponding lamp voltage Vcm(4) is lowered.

In FIG. 14, dashed dotted line Vcmd4(28) represents a waveform of a lamp voltage on July 28 and solid line Vcmd4(12) represents a waveform of a lamp voltage on August 12, although not specifically limited. The value of the lamp voltage Vcmd4(12) is smaller than that of the lamp voltage Vcmd4(28), although the difference between the values is very small. As described in the second embodiment, this very small difference can be revealed by comparison between an integral value of the lamp voltage Vcmd4(12) (an integral value of the lamp voltage ratio) Vcmd4s for the period in which the temperature is 950° C. or higher (the period from the time t1 to the time t2) and an integral value of the lamp voltage Vcmd4(28) (the integral value of the lamp voltage ratio) Vcmd4s, although this difference is very small. Consequently, disconnection of the halogen lamp can be predicted before occurrence of the disconnection.

Also to the management computer MPC, the heat-generation-source information represented by the statistic value is supplied from the first computer FEPC. However, because this heat-generation-source information is averaged heat-generation-source information, it is difficult to detect a sign (drop of the lamp voltage) before disconnection of a halogen lamp. Meanwhile, in the second embodiment, the integral value of the lamp voltage ratio is obtained for each zone. Therefore, the sign before disconnection of the halogen lamp can be detected on a zone-by-zone basis (by zones).

The waveform chart shown in FIG. 13 may be created in the second computer EEPC like FIG. 12, or may be created in the management computer MPC. The information generated in Step S21 in FIG. 10 includes the temperature detection information and the heat-generation-source information. Therefore, the second computer EEPC can create the waveform shown in FIG. 13 by calculating integration of the heat-generation-source information when the temperature detection information indicates a predetermined temperature (950° C.) or higher, for example. Further, the management computer MPC can create the waveform shown in FIG. 13 like the second computer EEPC, because the provided information includes the temperature detection information and the heat-generation-source information.

Figure 15:
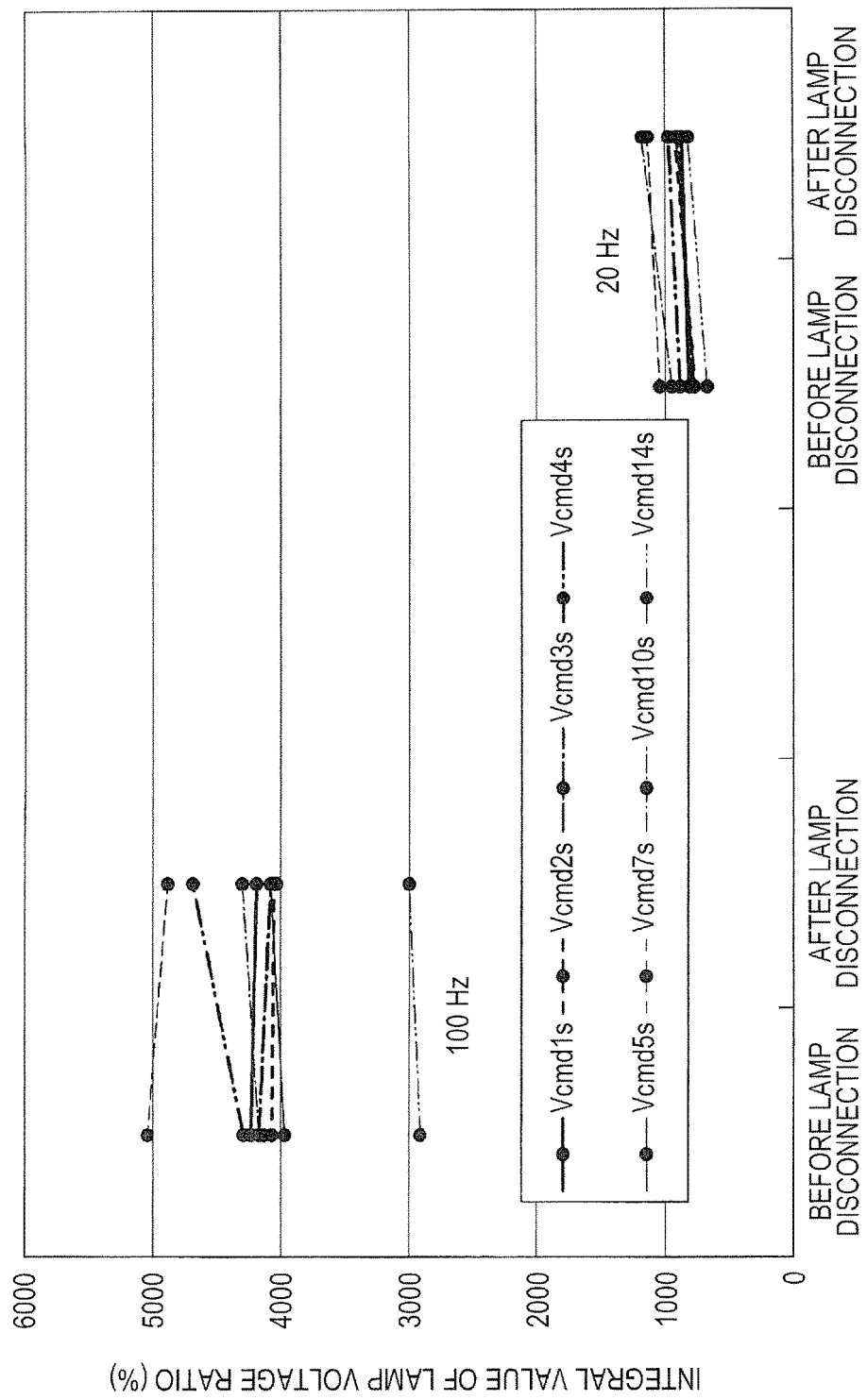
FIG. 15 is a characteristic diagram showing a relation between an integral value of a lamp voltage ratio and a sampling frequency according to the second embodiment.

FIG. 15 is a characteristic diagram showing a relation between an integral value of a lamp voltage ratio and a sampling frequency according to the second embodiment. In FIG. 15, the integral value of the lamp voltage ratio when the sampling frequency is 100 Hz is shown in the left portion, while the integral value of the lamp voltage ratio when the sampling frequency is 20 Hz is shown in the right portion. Although the integral values of the lamp voltage ratios Vcmd1s to Vcmd14s respectively corresponding to the zones Vcm0 to Vcm14 are obtained, only specific ones of those are shown in FIG. 15, as in FIG. 13, in the same representation manner as that in FIG. 13. The integral value of the lamp voltage ratio is obtained by integration of the lamp voltage ratio for the period in which the temperature is the predetermined temperature (950° C.) or higher, as already described.

In FIG. 15, the vertical axis represents the integral value of the lamp voltage ratio. The horizontal axis represents time, and shows time before disconnection of a halogen lamp (before the lamp has gone out) and after disconnection of the lamp (after the lamp has gone out). Also in FIG. 15, the case where a halogen lamp arranged in the zone Vcm4 is disconnected is shown. As is understood from FIG. 15, the magnitude of the change between before and after disconnection of the halogen lamp can be made larger by making the sampling frequency higher. Thus, it is possible to detect disconnection more surely by monitoring.

<Manufacturing Method of Semiconductor Device>

Figure 16:
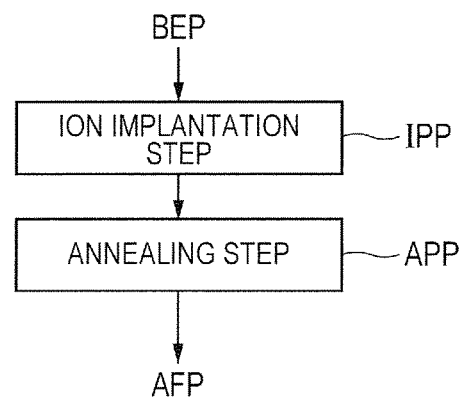
FIG. 16 is a flowchart of a manufacturing method of a semiconductor device according to the second embodiment.
Figure 17A:
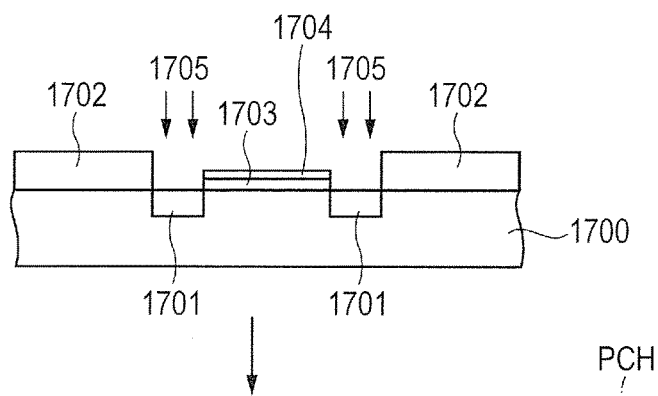
FIGS. 17A and 17B are cross-sectional views showing the manufacturing method of the semiconductor device according to the second embodiment.
Figure 17B:
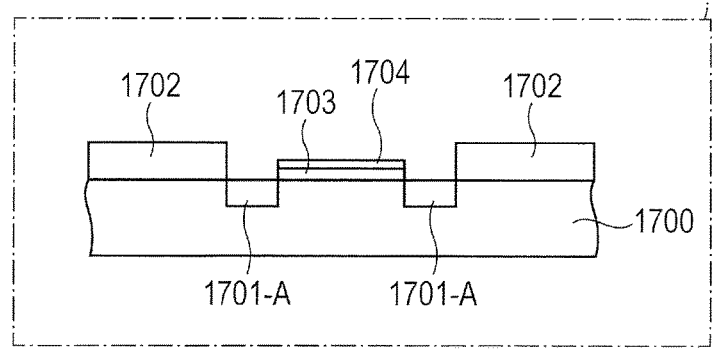

FIG. 16 is a flowchart of a manufacturing method of a semiconductor device according to the second embodiment. In particular, of the manufacturing method of the semiconductor device, an ion implantation step IPP and an annealing step APP performed after the ion implantation step IPP are shown in FIG. 16. FIGS. 17A and 17B are cross-sectional views of the semiconductor device in the ion implantation step IPP and the annealing step APP according to the second embodiment.

In a step BEP prior to the ion implantation step IPP, an opening is formed in a predetermined region of a semiconductor wafer. For example, the opening is formed in regions (predetermined regions) that are to form a source region and a drain region of an MOSFET.

In the ion implantation step (an impurity implantation step) IPP, impurity ions 1705 are implanted into the predetermined region formed in a semiconductor substrate 1700, as shown in FIG. 17A. In FIG. 17A, 1702 denotes an insulation film formed over the semiconductor substrate 1700, 1703 denotes a gate insulation film, and 1704 denotes a gate electrode formed over the gate insulation film 1703. A region between the gate electrode 1704 (the gate insulation film 1703) and the insulation film 1702 is the predetermined region 1701 into which the impurity ions 1705 are implanted.

In the annealing step APP, the semiconductor wafer with the impurity ions 1705 implanted thereto is carried into the process chamber PCH, as described in FIG. 1. The wafer carried into the process chamber PCH is heated by a lamp to be subjected to annealing. In this annealing, lamp voltages Vcm(0) to Vcm(14) and temperature detection signals TSS (0) to TSS(6) are sampled at 100 Hz, as described above, so that pieces of heat-generation-source information and pieces of temperature information are obtained. Based on the pieces of heat-generation-source information and the pieces of temperature information thus obtained, integral values of lamp voltage ratios corresponding to all the zones are obtained. For example, the integral values of the lamp voltage ratios corresponding to all the zones are obtained every day, the waveform chart as shown in FIG. 13 is created, and the state of the lamp is monitored based on a change with time of the integral values of the lamp voltage ratios corresponding to the respective zones.

In the present embodiment, by using this spike annealing device, it is possible to control expansion of the source region and the drain region of the MOSFET and to obtain an appropriate activation ratio of the impurities. Therefore, reliability of the semiconductor device can be improved.

The case using the second embodiment has been described as the manufacturing method of the semiconductor device. However, the present invention is not limited thereto. That is, the manufacturing method may monitor the state of the lamp based on the pieces of heat-generation-source information obtained by sampling at 100 Hz as described in the first embodiment.

The wafer processed in the annealing step APP is transferred to a subsequent step AFP. In the step AFP, a plurality of semiconductor chips are cut out from the wafer and are packaged, for example. In this manner, the semiconductor device is provided.

The state of the lamp may be monitored at a predetermined time interval, for example, once a day when annealing is performed for one wafer. However, in order to monitor the state of the lamp more accurately, it is desirable to monitor the state of the lamp every time annealing is performed.

The invention made by the inventors have been specifically described above, based on the embodiments. However, the present invention is not limited to the aforementioned embodiments, but can be modified in various ways without departing from the summary of the invention.

What is claimed is:

1. A monitoring method, comprising:
performing sampling of outputs of a plurality of thermometers at a first frequency and controlling a plurality of heat generation sources based on temperature information obtained by the sampling;
forming information based on temperature information obtained by the sampling at the first frequency and pieces of heat-generation-source information obtained by sampling of outputs of the respective heat generation sources at the first frequency; and
monitoring states of the heat generation sources based on the temperature information obtained by the sampling at the first frequency and the pieces of heat-generation-source information obtained by the sampling at the first frequency,
wherein the monitoring of the states of heat generation sources comprises monitoring an integral value obtained by integrating the pieces of heat-generation-source information obtained by the sampling at the first frequency.

2. The monitoring method according to claim 1,
wherein the performing of the sampling and the controlling of the plurality of heat generation sources is performed by a first control device, and the forming of the information is performed by a second control device,
wherein the first control device:
converts temperature information obtained by sampling of an output from a predetermined one of the thermometers at the first frequency to temperature information corresponding to one obtained by sampling at a second frequency lower than the first frequency, and outputs the temperature information obtained by conversion as a statistic value to a third control device; and
generates pieces of heat-generation-source information corresponding to ones obtained by sampling at the second frequency from the outputs of the heat generation sources, and outputs an average value of the generated pieces of heat-generation-source information as a statistic value to the third control device, and
wherein the second control device supplies specifying information that specifies an object to be processed, subjected to a thermal process by the heat generation sources, the temperature information obtained by the sampling at the first frequency, and the pieces of heat-generation-source information obtained by the sampling at the first frequency to the third control device as the information.

3. The monitoring method according to claim 2,
wherein each of the heat generation sources includes a halogen lamp, and
the first frequency is 100 Hz and the second frequency is 20 Hz.

4. The monitoring method according to claim 1,
wherein a state of a heat generation source is monitored based on a change of a piece of heat-generation-source information obtained by the sampling at the first frequency.

5. The monitoring method according to claim 1,
wherein a period in which the temperature information obtained by the sampling at the first frequency indicates a first temperature or higher in a first period in which the pieces of heat-generation-source information are integrated.

6. The monitoring method according to claim 5,
wherein a sign of disconnection of a heat generation source is detected based on a change of the integral value.

7. The monitoring method according to claim 1,
wherein the heat generation sources include a plurality of halogen lamps arranged to be opposed to an object to be processed by a thermal process, the halogen lamps being divided into a plurality of zones based on positions at which the halogen lamps are arranged,
outputs of halogen lamps of each of the zones are sampled at the first frequency to obtain the pieces of heat-generation-source information, and
states of the halogen lamps are monitored on a zone-by-zone basis based on the temperature information obtained by the sampling at the first frequency and the pieces of heat-generation-source information from each of the zones.

8. The monitoring method according to claim 7,
wherein the pieces of heat-generation-source information from each of the zones is integrated for a period in which the temperature information indicates a first temperature or higher, and the states of the halogen lamps are monitored on the zone-by-zone basis based on a change of an integral value obtained by integration.

9. The monitoring method according to claim 8,
wherein a sign of disconnection of a halogen lamp is detected on the zone-by-zone basis based on the change of the integral value.

10. A manufacturing method of a semiconductor device, comprising:
implanting impurities to a semiconductor region; and
performing annealing,
wherein a plurality of heat generation sources used in a thermal process in the annealing are monitored by the monitoring method according to claim 1.

11. The monitoring method according to claim 1, wherein the plurality of heat generation sources comprises a plurality of lamps, and
wherein the heat-generation-source information comprises a lamp voltage ratio for the plurality of lamps.

12. The monitoring method according to claim 11, wherein the monitoring of the states of the heat generation sources comprises detecting a disconnection of a lamp of the plurality of lamps.

13. A monitoring system, comprising:
a first control device that performs sampling of outputs of a plurality of thermometers at a first frequency and controls a plurality of heat generation sources based on temperature information obtained by the sampling;
a second control device that forms information based on temperature information obtained by the sampling at the first frequency and pieces of heat-generation-source information obtained by sampling of outputs of the respective heat generation sources at the first frequency; and
a monitoring device that monitors states of the heat generation sources based on the temperature information obtained by the sampling at the first frequency and the pieces of heat-generation-source information obtained by the sampling at the first frequency,
wherein the monitoring device monitors an integral value obtained by integrating the pieces of heat-generation-source information obtained by the sampling at the first frequency.

14. The monitoring system according to claim 13, wherein the first control device:
converts temperature information obtained by sampling of an output from a predetermined one of the thermometers at the first frequency to temperature information corresponding to one obtained by sampling at a second frequency lower than the first frequency, and outputs the temperature information obtained by conversion as a statistic value to a third control device; and
generates pieces of heat-generation-source information corresponding to ones obtained by sampling at the second frequency from the outputs of the heat generation sources, and outputs an average value of the generated pieces of heat-generation-source information as a statistic value to the third control device, and
wherein the second control device supplies specifying information that specifies an object to be processed, subjected to a thermal process by the heat generation sources, the temperature information obtained by the sampling at the first frequency, and the pieces of heat-generation-source information obtained by the sampling at the first frequency to the third control device as the information.

15. The monitoring system according to claim 13, wherein the plurality of heat generation sources comprises a plurality of lamps, and
wherein the heat-generation-source information comprises a lamp voltage ratio for the plurality of lamps.

16. The monitoring system according to claim 15, wherein the monitoring of the states of the heat generation sources comprises detecting a disconnection of a lamp of the plurality of lamps.

* * * * *